US011653488B2

(12) United States Patent
Yang et al.

(10) Patent No.: US 11,653,488 B2
(45) Date of Patent: May 16, 2023

(54) APPARATUSES INCLUDING TRANSISTORS, AND RELATED METHODS, MEMORY DEVICES, AND ELECTRONIC SYSTEMS

(71) Applicant: Micron Technology, Inc., Boise, ID (US)

(72) Inventors: Litao Yang, Boise, ID (US); Srinivas Pulugurtha, Boise, ID (US); Haitao Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/869,339

(22) Filed: May 7, 2020

(65) Prior Publication Data

US 2021/0351182 A1 Nov. 11, 2021

(51) Int. Cl.
*H01L 21/322* (2006.01)
*H01L 27/11* (2006.01)
(Continued)

(52) U.S. Cl.
CPC .... *H01L 27/10802* (2013.01); *H01L 23/5225* (2013.01); *H01L 29/42392* (2013.01);
(Continued)

(58) Field of Classification Search
CPC ........... H01L 29/66969; H01L 21/0262; H01L 29/7869; H01L 29/78642; H01L 29/78696; H01L 29/7827
See application file for complete search history.

(56) References Cited

U.S. PATENT DOCUMENTS 5,338,959 A 8/1994 Kim et al.
6,888,181 B1 5/2005 Liao et al.
(Continued)

OTHER PUBLICATIONS

Chen et al., Orders-of-Magnitude Enhancement in Conductivity Tuning in InGaZnO Thin-Film Transistors via SiNx Passivation and Dual-Gate Modulation, Journal of Information Display, https://www.tandfonline.com/doi/full/10.1080/15980316.2019.1649729, (2019), 8 pages.

(Continued)

*Primary Examiner* — Brian Turner
(74) *Attorney, Agent, or Firm* — TraskBritt

(57) ABSTRACT

An apparatus comprises a first conductive structure and at least one transistor in electrical communication with the first conductive structure. The at least one transistor comprises a lower conductive contact coupled to the first conductive structure and a split-body channel on the lower conductive contact. The split-body channel comprises a first semiconductive pillar and a second semiconductive pillar horizontally neighboring the first semiconductive pillar. The at least one transistor also comprises a gate structure horizontally interposed between the first semiconductive pillar and the second semiconductive pillar of the split-body channel and an upper conductive contact vertically overlying the gate structure and coupled to the split-body channel. Portions of the gate structure surround three sides of each of the first semiconductive pillar and the second semiconductive pillar. Memory devices, electronic systems, and methods of forming the apparatus are also disclosed.

21 Claims, 8 Drawing Sheets

(51) Int. Cl.
*H01L 29/76* (2006.01)
*H01L 29/792* (2006.01)
*H01L 27/1157* (2017.01)
*H01L 27/108* (2006.01)
*H01L 23/522* (2006.01)
*H01L 29/423* (2006.01)
*H01L 29/66* (2006.01)
*H01L 29/786* (2006.01)
*H01L 29/78* (2006.01)

(52) U.S. Cl.
CPC .... *H01L 29/66969* (2013.01); *H01L 29/7841* (2013.01); *H01L 29/7869* (2013.01); *H01L 29/78642* (2013.01); *H01L 29/78696* (2013.01)

(56) References Cited

U.S. PATENT DOCUMENTS

| | | | |
|---|---|---|---|
| 7,994,566 B2 | 8/2011 | Mouli | |
| 2004/0036127 A1 | 2/2004 | Chau et al. | |
| 2005/0199950 A1 | 9/2005 | Chau et al. | |
| 2008/0073667 A1 | 3/2008 | Lochtefeld | |
| 2010/0214851 A1* | 8/2010 | Nirschl | G11C 16/24 365/185.23 |
| 2011/0316042 A1* | 12/2011 | Tang | H01L 29/66363 257/107 |
| 2014/0319466 A1* | 10/2014 | Dasgupta | H01L 51/0562 438/99 |
| 2014/0369126 A1* | 12/2014 | Lee | G11C 16/0483 365/185.17 |
| 2015/0035037 A1* | 2/2015 | Sakuma | H01L 27/108 257/314 |
| 2015/0221738 A1* | 8/2015 | Ahn | H01L 29/4958 257/314 |
| 2015/0364542 A1* | 12/2015 | Rodder | H01L 29/78696 257/29 |
| 2016/0079358 A1* | 3/2016 | Doornbos | H01L 29/0676 438/299 |
| 2016/0099254 A1* | 4/2016 | Park | H01L 27/11565 257/324 |
| 2016/0141301 A1* | 5/2016 | Mokhlesi | G11C 16/10 365/185.23 |
| 2016/0284722 A1* | 9/2016 | Lai | H01L 29/7926 |
| 2016/0335387 A1* | 11/2016 | Moroz | H01L 29/0676 |
| 2017/0025412 A1* | 1/2017 | Jun | H01L 29/775 |
| 2017/0062456 A1* | 3/2017 | Sugino | H01L 27/1157 |
| 2019/0027567 A1* | 1/2019 | Bhattacharyya | H01L 27/11568 |
| 2019/0067475 A1* | 2/2019 | Liu | H01L 29/42364 |
| 2019/0393267 A1* | 12/2019 | Pillarisetty | H01L 29/66666 |
| 2020/0098774 A1* | 3/2020 | Yeh | H01L 27/11582 |
| 2020/0135266 A1* | 4/2020 | Kumar | G11C 11/412 |

OTHER PUBLICATIONS

Karda et al., U.S. Appl. No. 16/596,090, titled Devices Including Vertical Transistors, and Related Methods, filed Oct. 8, 2019.

Nomura et al., Highly Stabel Amorphous In—Ga—Zn—O Thin-Film Transistors Porduced by Elimination Deep Subgap Defects, Phys. Lett., vol. 99, (2011), pp. 053505-1-053505-3.

* cited by examiner

APPARATUSES INCLUDING TRANSISTORS, AND RELATED METHODS, MEMORY DEVICES, AND ELECTRONIC SYSTEMS

TECHNICAL FIELD

Embodiments disclosed herein relate to microelectronic devices and microelectronic device fabrication. More particularly, embodiments of the disclosure relate to apparatuses including transistors including a gate electrode and opposing channel regions adjacent to the gate electrode, to related memory devices and electronic systems, and to methods of forming the apparatus.

BACKGROUND

Fabrication of device structures includes forming transistors that may be used to access, for example, a storage component of a memory cell of the device structure. The transistors include a channel region comprising a semiconductor material formulated and configured to conduct a current responsive to application of a threshold voltage and hinder the flow of current in the absence of the threshold voltage.

In device structures including memory cells, the transistors associated with the memory cells (e.g., as access devices) may comprise so-called vertical transistors, such as vertical thin film transistors (TFTs). Forming vertical transistors often includes stacking materials that will eventually form the transistors of the memory cell, the materials including source and drain contacts, channel regions, and gate electrode materials. The materials of the stack may be patterned to form pillar structures including the stack of materials.

Channel regions of the transistors include semiconductor material. However, semiconductor materials employed in many conventional transistors effectuate a high off current ($I_{off}$), which may affect charge retention, the flow of current, and other electrical properties of horizontally neighboring transistors. For example, a high off current of a transistor may affect (e.g., disturb) the condition of horizontally neighboring transistor when the horizontally neighboring transistor is accessed. Such semiconductor materials may exhibit a low threshold voltage ($V_{TH}$) even when the transistor is scaled and includes a so-called "dual-gate" or "double-gate" electrode (e.g., two gate electrodes disposed around a central channel region) and, therefore, require a large negative voltage when the transistor is in the off state. Accordingly, dual-gate electrodes disposed around a central channel region may not be adequate to reduce leakage as a result of coupling capacitance between horizontally neighboring transistors as memory cells are scaled down in size to increase the density of the memory cells.

DETAILED DESCRIPTION

Figure 1A:
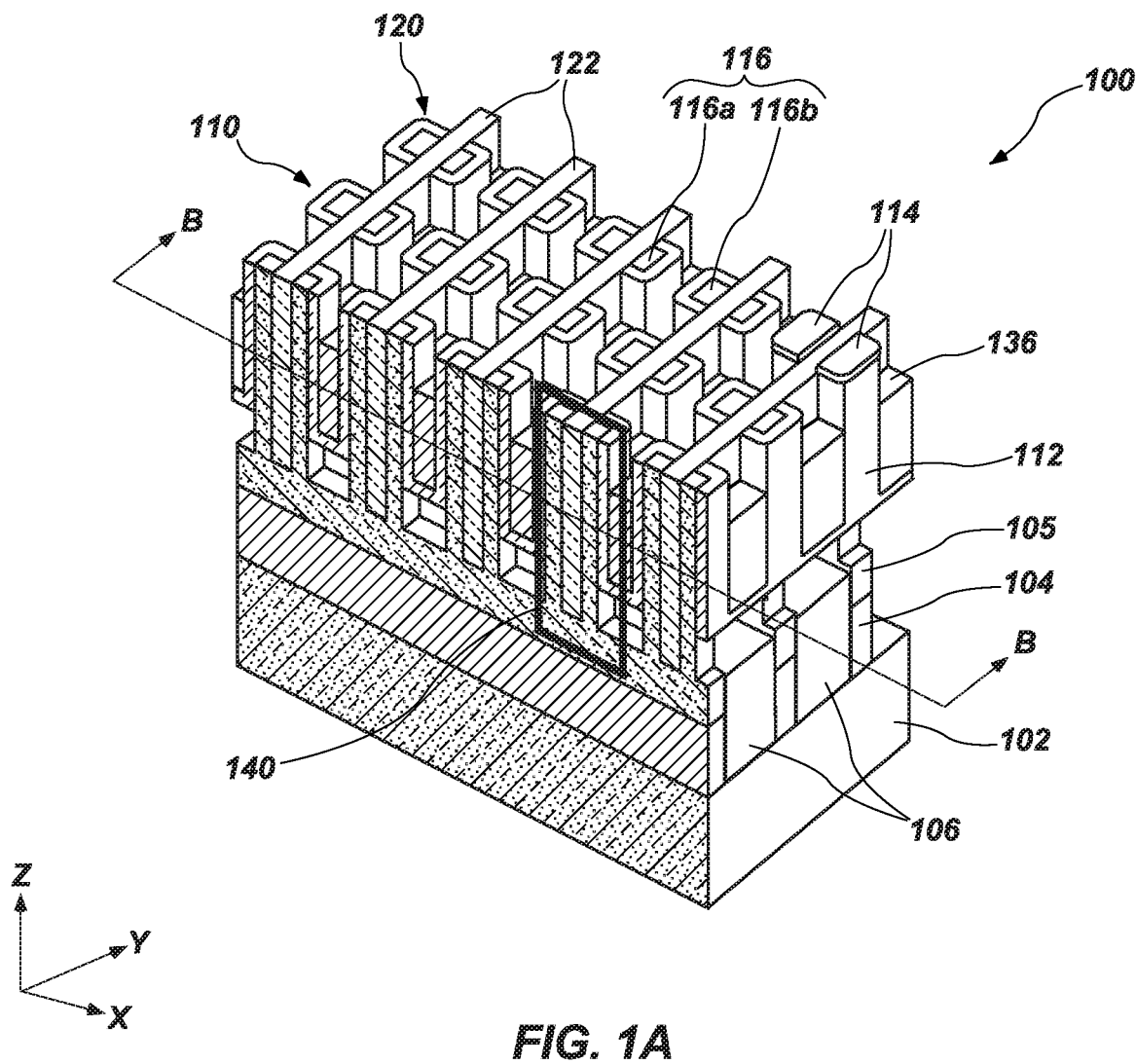
FIG. 1A is a simplified cutaway perspective view of an apparatus including transistors, in accordance with embodiments of the disclosure.

An apparatus (e.g., a microelectronic device, a semiconductor device, a memory device) is disclosed that includes a first conductive line, a second conductive line, and vertical transistors between the first conductive line and the second conductive line. Individual transistors include two channel regions, and a gate structure (e.g., a gate electrode) horizontally interposed between the two channel regions. The two channel regions of the individual transistor may be considered "split" by the gate electrode. The gate electrode surrounds three sides of each of the two channel regions of the individual transistor. The gate electrode surrounding each of the two channel regions of the transistor may allow increased gate performance and reduced leakage as a result of coupling capacitance between horizontally neighboring transistors of the apparatus. The use of a single (e.g., only one) gate electrode between the two channel regions allows the gate electrode to have a larger thickness as compared to the gate electrodes of conventional transistors (e.g., transistors exhibiting so-called "double gate" configurations), while the pitch between the horizontally neighboring transistors may be substantially the same as that of conventional transistors. In addition, the relatively larger thickness of the gate electrodes increases the area thereof, and therefore, reduces the electrical resistance of the gate electrodes as compared to conventional gate electrode configurations to provide enhanced performance in microelectronic device structures (e.g., DRAM device structures, such as DRAM cells), microelectronic devices (e.g., DRAM devices), and electronic systems that rely on high feature density. The apparatus may also include a passivation material on a side of each of the two channel regions opposite the gate electrode. In some embodiments, an electrically conductive material (e.g., a shielding material) is located between adjacent transistors and may be configured to be electrically biased. Biasing the electrically conductive material may reduce or prevent so-called "wordline disturb" wherein the gate electrode of one transistor affects the gate electrode of an adjacent transistor when a voltage is applied thereto.

The following description provides specific details, such as material compositions and processing conditions, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional fabrication techniques employed in the semiconductor industry. In addition, the description provided below does not form a complete process flow for manufacturing an apparatus. The structures described below do not form a complete microelectronic device. Only those process stages (e.g., acts) and structures necessary to understand the embodiments of the disclosure are described in detail below. Additional stages to form a complete microelectronic device may be performed by conventional fabrication techniques.

The materials described herein may be formed by conventional techniques including, but not limited to, spin coating, blanket coating, chemical vapor deposition (CVD), atomic layer deposition (ALD), plasma enhanced ALD, or physical vapor deposition (PVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "and/or" includes any and all combinations of one or more of the associated listed items.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, the term "configured" refers to a size, shape, orientation, and arrangement of one or more of at least one structure and at least one apparatus facilitating operation of one or more of the structure and the apparatus in a pre-determined way.

As used herein, the term "pitch" refers to a distance between identical points in two adjacent (e.g., neighboring) features.

As used herein, reference to an element as being "on" or "over" another element means and includes the element being directly on top of, directly adjacent to (e.g., directly laterally adjacent to, directly vertically adjacent to), directly underneath, or in direct contact with the other element. It also includes the element being indirectly on top of, indirectly adjacent to (e.g., indirectly laterally adjacent to, indirectly vertically adjacent to), indirectly underneath, or near the other element, with other elements present therebetween. In contrast, when an element is referred to as being "directly on" or "directly adjacent to" another element, there are no intervening elements present.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "memory device" means and includes microelectronic devices exhibiting memory functionality, but not necessary limited to memory functionality. Stated another way, and by way of example only, the term "memory device" means and includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, the term "electrically conductive material" means and includes a material including one or more of at least one metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)); at least one alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel); at least one conductively doped semiconductor material (e.g., conductively doped polysilicon, conductively doped germanium (Ge), conductively doped silicon germanium (SiGe)); and at least one conductive metal-containing material (e.g., a conductive metal nitride, such as one or more of titanium nitride (TiN), tantalum nitride (TaN), tungsten nitride (WN), and titanium aluminum nitride (TiAlN); conductive metal silicide; a conductive metal carbide; a conductive metal oxide, such as one or more of iridium oxide (IrO) and ruthenium oxide (RuO)).

As used herein, the term "electrically insulative material" means and includes at least one dielectric material, such as one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x", "y", and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, the dielectric material may comprise one or more stoichiometric compounds and/or one or more non-stoichiometric compounds, and values of "x", "y", and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions.

As used herein, the phrase "coupled to" refers to structures operatively connected with each other, such as electrically connected through a direct ohmic connection or through an indirect connection (e.g., via another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, the term "substrate" means and includes a material (e.g., a base material) or construction upon which additional materials are formed. The substrate may be a semiconductor substrate, a base semiconductor material on a supporting structure, a metal electrode, or a semiconductor substrate having one or more materials, layers, structures, or regions formed thereon. The materials on the semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Figure 1B:
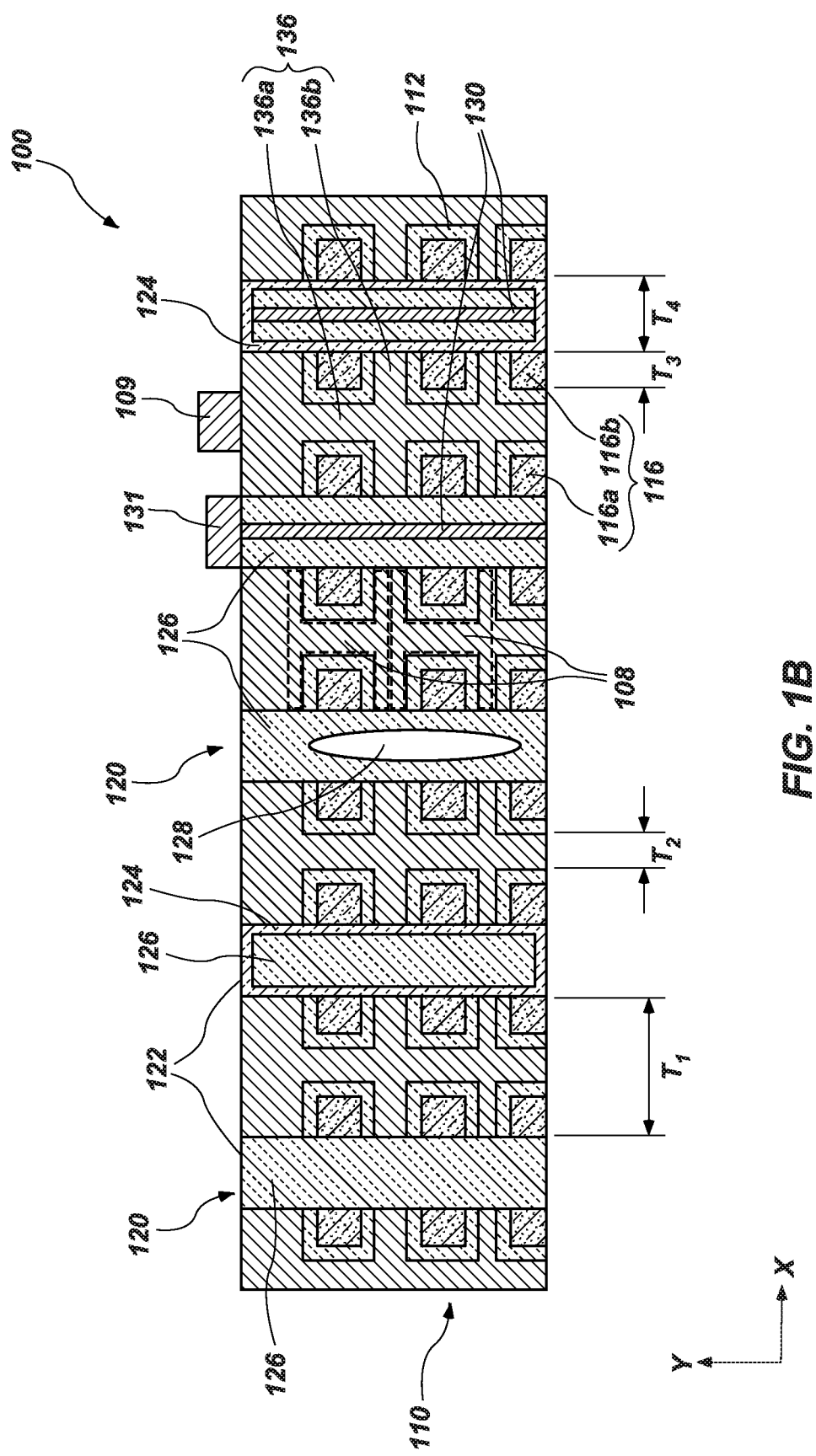
FIG. 1B is a simplified top cross-sectional view of the apparatus of FIG. 1A taken along section line B-B of FIG. 1A.

FIG. 1A is a simplified cutaway perspective view of a microelectronic device structure 100 for a microelectronic device (e.g., a memory device), in accordance with embodiments of the disclosure. FIG. 1B is a simplified top cross-sectional view of the microelectronic device structure 100 of FIG. 1A taken along section line B-B of FIG. 1A. The microelectronic device structure 100 includes transistors 110 (e.g., access devices) over a base material 102. The base material 102 may be, for example, a semiconductor substrate, a base semiconductor layer on a supporting structure, a metal electrode or a semiconductor substrate having one or more layers, structures or regions formed thereon. The base material 102 may be a conventional silicon substrate or other bulk substrate comprising a layer of semiconductive material. The base material 102 may be doped or undoped.

With reference to FIG. 1A in combination with FIG. 1B, the transistors 110 may be arranged in rows (e.g., extending in the X-direction) and columns (e.g., extending in the Y-direction). In some embodiments, the rows are substantially perpendicular to the columns. However, the disclosure is not so limited and the transistors 110 may be arranged in a pattern different than that illustrated in FIG. 1A and FIG. 1B. The microelectronic device structure 100 may include, for example, any number of transistors 110, such as more than about 1,000 transistors 110, more than about 10,000 transistors 110, or more than about 100,000 transistors 110. For convenience in describing FIGS. 1A and 1B, a first direction may be defined as a direction, shown in FIGS. 1A and 1B, as the X-direction. A second direction, which is transverse (e.g., perpendicular) to the first direction, shown in FIGS. 1A and 1B, as the Y-direction. A third direction, which is transverse (e.g., perpendicular) to each of the first direction and the second direction, may be defined as a direction (e.g., vertical direction), shown in FIG. 1A, as the Z-direction. Similar directions may be defined, as shown in FIGS. 2A through 2K, as discussed in greater detail below.

As shown in FIG. 1A, the microelectronic device structure 100 may include first conductive lines 104 over at least a portion of the base material 102. In some embodiments, the first conductive lines 104 are arranged in rows extending in a first direction (e.g., the X-direction) along the base material 102. The first conductive lines 104 may be in electrical communication with individual transistors 110 of a row of transistors 110. In some embodiments, the first conductive lines 104 are employed as digit lines (e.g., data lines, bit lines). In other embodiments, the first conductive lines 104 are employed as source lines.

The first conductive lines 104 may be formed of and include at least one electrically conductive material. In some embodiments, the first conductive lines 104 are formed of and include W. In other embodiments, the first conductive lines 104 are formed of and include Ru. The first conductive lines 104 of adjacent rows may be electrically isolated from each other, such as through an electrically insulative material 106. In some embodiments, the electrically insulative material 106 is formed of and includes $SiO_2$.

With continued reference to FIG. 1A, each of the transistors 110 may include a lower conductive contact 105, an upper conductive contact 114, a split-body channel 116 including a first channel region 116a and a second channel region 116b vertically between the lower conductive contact 105 and the upper conductive contact 114, a gate electrode structure 108 horizontally interposed between the first channel region 116a and a second channel region 116b of the split-body channel 116 and surrounded on at least some sides thereof by a gate dielectric material 112.

The lower conductive contact 105 may include, for example, a source contact or a drain contact. The lower conductive contact 105 of a transistor 110 may be in electrical communication with a respective first conductive line 104. The lower conductive contact 105 may include an electrically conductive material. In some embodiments, the lower conductive contact 105 is formed of and includes substantially the same material composition as the first conductive lines 104.

The electrically insulative material 106 may electrically isolate the lower conductive contacts 105 of some horizontally neighboring transistors 110. For clarity and ease of understanding the drawings and associated description, only two portions of the electrically insulative material 106 are illustrated between adjacent portions of each of the first conductive lines 104 and the lower conductive contact 105 in FIG. 1A. However, the disclosure is not so limited, and additional portions of the electrically insulative material 106 may be included.

Channel regions including the first channel region 116a (e.g., a first semiconductive pillar) and the second channel region 116b (e.g., a second semiconductive pillar) of the split-body channel 116 may be laterally adjacent to the gate dielectric material 112. In some embodiments, each of the first channel region 116a and the second channel region 116b are substantially surrounded by the gate dielectric material 112 on at least three sides, as shown in FIG. 1B. Stated another way, the gate dielectric material 112 may extend between the gate electrode structures 108 and opposing portions of the first channel region 116a and the second channel region 116b of two adjacent (e.g., neighboring) split-body channels 116. Each of the first channel region 116a and the second channel region 116b are formed of and include a semiconductor material formulated and configured to exhibit electrical conductivity responsive to application of a suitable voltage (e.g., a threshold voltage $V_{TH}$) to the transistor 110 between the gate electrode structure 108 and the source region (e.g., the first conductive line 104). In some embodiments, each of the first channel region 116a and the second channel region 116b contact the lower conductive contact 105 and extend along sidewalls of the gate dielectric material 112 to contact the upper conductive contact 114. Accordingly, each of the first channel region 116a and the second channel region 116b may directly contact each of the lower conductive contact 105 and the upper conductive contact 114. The first channel region 116a and the second channel region 116b may each be in electrical communication with each of a source region and a drain region of the transistor 110 associated with the first channel region 116a and the second channel region 116b.

As discussed above, each of the first channel region 116a and the second channel region 116b are formed of and include a material formulated to conduct current responsive to application of a suitable voltage (e.g., a threshold voltage, a set bias voltage, a read bias voltage) to the transistors 110. In some embodiments, the first channel region 116a and the second channel region 116b include a polycrystalline silicon (also known as "polysilicon") material. In other embodiments, the first channel region 116a and the second channel region 116b are formed of and include a semiconductive material having a larger bandgap than polycrystalline silicon, such as a bandgap greater than about 1.65 electron volts (eV), and may be referred to herein as a so-called "large bandgap material." For example, each of the first channel region 116a and the second channel region 116b may be formed of and include an oxide semiconductor material, such as one or more of zinc tin oxide ($Zn_xSn_yO$, commonly referred to as "ZTO"), indium zinc oxide ($In_xZn_yO$, commonly referred to as "IZO"), zinc oxide ($Zn_xO$), indium gallium zinc oxide ($In_xGa_yZn_zO$, commonly referred to as "IGZO"), indium gallium silicon oxide ($In_xGa_ySi_zO$, commonly referred to as "IGSO"), indium tungsten oxide ($In_xW_yO$, commonly referred to as "IWO"), indium oxide ($In_xO$), tin oxide ($Sn_xO$), titanium oxide ($Ti_xO$), zinc oxide nitride ($Zn_xON_z$), magnesium zinc oxide ($Mg_xZn_yO$), zirconium indium zinc oxide ($Zr_xIn_yZn_zO$), hafnium indium zinc oxide ($Hf_xIn_yZn_zO$), tin indium zinc oxide ($Sn_xIn_yZn_zO$), aluminum tin indium zinc oxide ($Al_xSn_yIn_zZn_aO$), silicon indium zinc oxide ($Si_xIn_yZn_zO$), aluminum zinc tin oxide ($Al_xZn_ySn_zO$), gallium zinc tin oxide ($Ga_xZn_ySn_zO$), zirconium zinc tin oxide ($Zr_xZn_ySn_zO$), and other similar materials. Formulae including at least one of "x", "y", "z", and "a" above (e.g., $Zn_xSn_yO$, $In_xZn_yO$, $In_xGa_yZn_zO$, $In_xW_yO$, $In_xGa_ySi_zO$, $Al_xSn_yIn_zZn_aO$) represent a composite material that contains, throughout one or more regions thereof, an average ratio of "x" atoms of one element, "y" atoms of another element (if any), "z" atoms of an additional element (if any), and "d" atoms of a further element (if any) for every one atom of oxygen (O). As the formulae are representative of relative atomic ratios and not strict chemical structure, the channel regions may comprise one or more stoichiometric compounds and/or one or more non-stoichiometric compounds, and values of "x", "y", "z", and "a" may be integers or may be non-integers. In some embodiments, the first channel region 116a and the second channel region 116b include IGZO. In some embodiments, the first channel region 116a and the second channel region 116b may have an In:Ga:Zn:O ratio of 1:1:1:4; may have an $In_2O_3$:$Ga_2O_3$:ZnO ratio of 2:2:1, or may be represented by the formula $InGaO_3(ZnO)_5$. In additional embodiments, the first channel region 116a and the second channel region 116b are formed of and include IGZO and IGSO.

In some embodiments, each of the first channel region 116a and the second channel region 116b includes a single material having a substantially uniform composition. In other embodiments, the first channel region 116a and the second channel region 116b include a composite structure including more than one type of semiconductor material (e.g., oxide semiconductor material). The first channel region 116a and the second channel region 116b may also be a so-called "multilayer" channel region, including more than one semiconductor material. For example, the first channel region 116a and the second channel region 116b include two different semiconductor materials, three semiconductor materials, four semiconductor materials, five semiconductor materials, etc. For example, material within the first channel region 116a and the second channel region 116b may exhibit a different atomic percent of one or more of indium, gallium, and zirconium than adjacent channel materials. In addition, differing channel materials may include the same elements as adjacent channel materials, but may exhibit a different stoichiometry (and composition) than the adjacent channel materials. The material of the first channel region 116a and the second channel region 116b within a single transistor 110 may be the same or different.

Discrete portions of each of the first channel region 116a and the second channel region 116b may have a thickness $T_3$ between about 5 Å and about 200 Å, such as between about 5 Å and about 10 Å, between about 10 Å and about 25 Å, between about 25 Å and about 50 Å, between about 50 Å and about 100 Å, or between about 100 Å and about 200 Å.

In some such embodiments, individual transistors 110 may include a single gate electrode structure 108 and two discrete channel regions (e.g., the first channel region 116a and the second channel region 116b). The first channel region 116a and the second channel region 116b of a single transistor 110 may surround the gate electrode structure 108 and may be located adjacent to the gate electrode structure 108, such as at, for example, opposing sides of the gate electrode structure 108. In other words, the gate electrode structure 108 may be centrally located and extend around each of the first channel region 116a and the second channel region 116b of the individual transistors 110. Accordingly, each of the first channel region 116a and the second channel region 116b contacts the gate electrode structure 108 in a first plane (e.g., in the X-direction) and in a second plane (e.g., in the Y-direction) intersecting the first plane. The gate electrode structure 108 may be formed of and include an electrically conductive material. In some embodiments, each gate electrode structure 108 is formed of and includes W or Ru.

The microelectronic device structure 100 may include electrically conductive contacts 109 (FIG. 1B) in electrical communication with the gate electrode structures 108. In some embodiments, each column of the transistors 110 (FIG. 1A) include at least one electrically conductive contact 109 in electrical communication with the gate electrode structures 108 of its corresponding column. The at least one electrically conductive contact 109 (e.g., at least one conductive routing structure) may be coupled to and extend from and between at least some of the gate electrode structures 108 and at least one other structure of the microelectronic device structure 100. The electrically conductive contacts 109 are formed of and include an electrically conductive material. In some embodiments, the electrically conductive contacts 109 are formed of and include substantially the same material composition as the gate electrode structures 108. In other embodiments, the electrically conductive contacts 109 are formed of and include a material different from the material of the gate electrode structures 108.

The electrically conductive contacts 109 may be in electrical communication with a voltage source configured to provide a suitable voltage (e.g., a bias voltage) to the gate electrode structures 108 associated with the electrically conductive contacts 109. For clarity and ease of understanding the drawings and associated description, only one electrically conductive contact 109 is illustrated adjacent to one of the gate electrode structures 108 in FIG. 1B. However, the disclosure is not so limited, and additional electrically conductive contacts 109 may be included.

The gate dielectric material 112 may be disposed around at least some sides of the gate electrode structure 108. In some embodiments, the gate dielectric material 112 extends between the gate electrode structures 108 and the first channel region 116a and the second channel region 116b of the split-body channels 116. In some such embodiments, the gate electrode structure 108 is substantially surrounded on all sides thereof (e.g., above, below, left, right, front, back, etc.) with a dielectric material. Stated another way, the gate dielectric material 112 may be located horizontally between the gate electrode structures 108 and the three sides of each of the first channel region 116a and the second channel region 116b of the split-body channels 116. As will be described herein, the gate dielectric material 112 may be located adjacent to upper surfaces and/or sidewalls of split-body channels 116.

The gate dielectric material 112 may be formed of and include one or more electrically insulative materials. In some embodiments, the gate dielectric material 112 is formed of and includes silicon dioxide. In some embodiments, the gate dielectric material 112 is formed of and includes substantially the same material composition as the electrically insulative material 106.

The gate dielectric material 112 may have a thickness between about 20 Å and about 100 Å, such as between about 20 Å and about 40 Å, between about 40 Å and about 60 Å, between about 60 Å and about 80 Å, or between about 80 Å and about 100 Å.

The upper conductive contact 114 of the transistors 110 may overlie the first channel region 116a and the second channel region 116b of the split-body channel 116. In some embodiments, the upper conductive contact 114 vertically overlays portions of the gate electrode structure 108 and may be separated therefrom by an electrically insulative material (e.g., the gate dielectric material 112). In some embodiments, the upper conductive contact 114 includes, for example, one of a source contact or a drain contact (while the lower conductive contact 105 includes the other of the source contact or the drain contact) of the transistors 110. One or more dielectric materials (e.g., the electrically insulative material 106, the gate dielectric material 112, the electrically insulative material 138) may vertically intervene between the gate electrode structure 108 and the upper conductive contact 114 and horizontally intervene between the gate electrode structure 108 and the upper conductive contact 114. The upper conductive contact 114 may include an electrically conductive material. In some embodiments, the upper conductive contact 114 is formed of and includes substantially the same material composition as the lower conductive contact 105. In other embodiments, the upper conductive contact 114 is formed of and includes a different material composition than the lower conductive contact 105. For clarity and ease of understanding the drawings and associated description, only two upper conductive contacts 114 are illustrated overlying the first channel region 116a and the second channel region 116b of the split-body channel 116 in FIG. 1A. However, the disclosure is not so limited, and additional upper conductive contacts 114 may be included.

The microelectronic device structure 100 may include second conductive lines 136 serving as the gate electrode structures 108 of the individual transistors 110. FIG. 1A illustrates portions of the second conductive lines 136, but it will be understood that in at least some embodiments, the second conductive lines 136 extend in a second direction (e.g., the Y-direction), different from the first direction in which the first conductive lines 104 extend. With reference to FIG. 1B, the second conductive lines 136 may include central elongated portions 136a that extend as lines extending in, for example, the Y-direction and lateral portions 136b extending away from the central elongated portions 136a in the X-direction. In other words, the lateral portions 136b may extend between horizontally neighboring channel regions (e.g., the first channel region 116a and the second channel region 116b) of the split-body channels 116, as shown in FIG. 1B. Stated another way, the second conductive lines 136 may surround the split-body channels 116 on at least three sides (e.g., three contiguous sides). In the embodiment shown in FIGS. 1A and 1B, the transistors 110 including the configuration (e.g., shape) of the second conductive lines 136 may be characterized as so-called "triple-gate" or "tri-gate" transistors for an individual device region 140. By using the tri-gate transistors, the device may allow reliable gate control during use and operation.

The second conductive lines 136 are formed of and include an electrically conductive material. In some embodiments, the second conductive lines 136 are formed of and include W or Ru. The electrically conductive material in the central elongated portions 136a and the lateral portions 136b may be the same or different. In some embodiments, the second conductive lines 136 are formed of and include substantially the same material composition as the first conductive lines 104. In other embodiments, the second conductive lines 136 are formed of and include a different material composition than the first conductive lines 104.

A thickness $T_1$ of the second conductive lines 136 (e.g., combined portions of the central elongated portions 136a and the lateral portions 136b) may be between about 60 Å and about 400 Å, such as between about 60 Å and about 100 Å, between about 100 Å and about 200 Å, between about 200 Å and about 300 Å, or between about 300 Å and about 400 Å. A thickness $T_2$ of the central elongated portions 136a (e.g., alone) of the second conductive lines 136 may be between about 30 Å and about 200 Å, such as between about 30 Å and about 50 Å, between about 50 Å and about 100 Å, between about 100 Å and about 150 Å, or between about 150 Å and about 200 Å.

With reference again to FIG. 1A and FIG. 1B, the microelectronic device structure 100 may include isolation regions 122 located within openings 120 extending in the second direction (e.g., the Y-direction in FIGS. 1A and 1B), different from the first direction in which the first conductive lines 104 extend and substantially parallel to the second direction in which the second conductive lines 136 extend. The isolation regions 122 may be located between horizontally neighboring transistors 110 and between the lateral portions 136b of adjacent second conductive lines 136. Accordingly, the isolation regions 122 may be located between adjacent transistors 110 in the first direction (e.g., the X-direction in FIG. 1B). The isolation regions 122 may include one or more dielectric materials including, without limitation, a passivation material 124, a dielectric material 126, and one or more air gaps 128 (e.g., void spaces). The passivation material 124 may be formed of and include at least one dielectric material including, but not limited to, an oxide, a nitride, or an oxynitride. In particular, the passivation material 124 may include, but is not limited to, an oxide material (e.g., silicon dioxide ($SiO_2$), yttrium oxide ($Y_2O_3$)), or a nitride material, (e.g., silicon nitride ($SiN_x$)). The dielectric material 126 may be formed of and include at least one dielectric material, such as one or more of at least one oxide dielectric material (e.g., one or more of $SiO_x$, $AlO_x$, phosilicate glass, borosilicate glass, borophosphosilicate glass, fluorosilicate glass), at least one nitride dielectric material (e.g., $SiN_y$), and at least one low-K dielectric material (e.g., one or more of silicon oxycarbide ($SiO_xC_y$), silicon oxynitride ($SiO_xN_y$), hydrogenated silicon oxycarbide ($SiC_xO_yH_z$), and silicon oxycarbonitride ($SiO_xC_zN_y$)). In some embodiments, the dielectric material 126 is formed of and includes substantially the same material composition as the electrically insulative material 106. The air gaps 128, if present, may extend adjacent to the transistors 110 and may laterally intervene between adjacent portions of the gate electrode structure 108 of the second conductive lines 136.

In some embodiments, an entirety of individual isolation regions 122 includes a single material including one of the passivation material 124, the dielectric material 126, or the air gaps 128. In other embodiments, two or more of the dielectric materials are used in combination, as illustrated in various configurations in FIG. 1B. The passivation material 124, for example, may be located adjacent exposed surfaces of each of the gate dielectric material 112, the first channel region 116a, the second channel region 116b, and the lateral portions 136b of the second conductive lines 136, and another one of the dielectric materials (e.g., the dielectric material 126, the air gaps 128) may be located in a remainder (e.g., a central portion) of the isolation regions 122 within the openings 120. In some embodiments, the passivation material 124 is in direct physical contact with portions of the gate electrode structure 108. The isolation regions 122 may include the passivation material 124 adjacent to the first channel region 116a on a first side and adjacent to the second channel region 116b on a second side. By way of non-limiting example, each side of the passivation material 124 may have a thickness between about 20 Å and about 80 Å (e.g., about 50 Å) with a remainder of a central portion of the isolation regions 122 being substantially filled with one or more of the dielectric material 126 and the air gaps 128. For example, the dielectric material 126 may have a thickness of between about 10 Å and about 30 Å (e.g., about 20 Å) with one or more of the air gaps 128 embedded therein. In yet other embodiments, the isolation regions 122 may include three or more regions of the dielectric materials. One of ordinary skill in the art will appreciate that the dielectric materials of the isolation regions 122 may be selectively positioned to achieve the desired requirements in isolating the transistors 110 from one another.

The isolation regions 122 may have a thickness $T_4$ between about 20 Å and about 1000 Å, such as between about 20 Å and about 100 Å, between about 100 Å and about 250 Å, between about 250 Å and about 500 Å, between about 500 Å and about 750 Å, or between about 750 Å and about 1000 Å.

The isolation regions 122 may also include a shielding material 130 extending in lines in the second direction (e.g., the Y-direction) and may be located between adjacent transistors 110 in the first direction (e.g., the X-direction). Accordingly, each transistor 110 may include a shielding material 130 on a first side thereof and another shielding material 130 on a second, opposite side thereof. The shielding material 130 may be electrically and physically isolated from each of the first channel region 116a and the second channel region 116b by one or more of the dielectric materials (e.g., the passivation material 124, the dielectric material 126, the air gaps 128). The shielding material 130 may also be electrically isolated from the first conductive lines 104 by at least the electrically insulative material 106, for example.

As will be described herein, the shielding material 130 may be formulated, configured, and electrically biased to substantially reduce or prevent wordline to wordline capacitance between the gate electrode structures 108 of adjacent transistors 110. Accordingly, the shielding material 130 may be configured to substantially reduce capacitance (e.g., wordline capacitance) between the gate electrode structures 108 of adjacent transistors 110.

The shielding material 130 may have a thickness between about 20 Å and about 100 Å, such as between about 20 Å and about 50 Å, between about 50 Å and about 75 Å, or between about 75 Å and about 100 Å. A distance between a lower surface of the shielding material 130 and a lower surface of the first channel region 116a and the second channel region 116b may be between about 20 Å and about 100 Å, such as between about 20 Å and about 100 Å, such as between about 20 Å and about 50 Å, between about 50 Å and about 75 Å, or between about 75 Å and about 100 Å. The distance may be controlled by the thickness of the electrically insulative material 106 or of the gate dielectric material 112.

The shielding material 130 is formed of and includes an electrically conductive material. In some embodiments, the shielding material 130 includes a material having a P+ type conductivity and may be referred to as a P+ body region. In other embodiments, the shielding material 130 includes an electrically conductive material. Suitable conductively-doped semiconductor materials may be doped with P-type dopants, such as boron, aluminum, gallium, or combinations thereof. In some embodiments, the shielding material 130 is formed of and includes tungsten. In other embodiments, the shielding material 130 is formed of and includes ruthenium. In some embodiments, the shielding material 130 is formed of and includes substantially the same material composition as at least one of the first conductive lines 104 or the second conductive lines 136.

The shielding material 130 may be in electrical communication with an electrically conductive contact 131 (FIG. 1B), which may be configured to provide a suitable bias to the shielding material 130. In some embodiments, the electrically conductive contact 131 is in electrical communication with a voltage source configured to bias the electrically conductive contact 131 and the associated shielding material 130. The voltage source to which the electrically conductive contact 131 is in electrical communication may be different than a voltage source with which the electrically conductive contacts 131 and the gate electrode structures 108 are in electrical communication. For clarity and ease of understanding the drawings and associated description, only one of the electrically conductive contacts 131 is illustrated adjacent the shielding material 130, additional electrically conductive contacts 131 in FIG. 1B. However, the disclosure is not so limited, and additional electrically conductive contacts 131 may be included.

In some embodiments, the electrically conductive contact 131 is formed of and includes substantially the same material composition as the shielding material 130. In other embodiments, the electrically conductive contact 131 includes a material different from the material of the shielding material 130. The electrically conductive contacts 131 may include substantially the same material composition as the electrically conductive contacts 109.

In some embodiments, the shielding material 130 is configured to be biased to a predetermined voltage when a gate electrode structure 108 of at least one transistor 110 adjacent to the shielding material 130 is selected (e.g., biased with a voltage). Without being bound by any particular theory, it is believed that when a switching voltage is applied to the gate electrode structures 108, since the first channel region 116a and the second channel region 116b are located outside (e.g., on sides) of the gate electrode structures 108 (rather than the gate electrode structure 108 being disposed around the channel regions), the first channel region 116a and the second channel region 116b of one transistor 110 may be influenced by the gate electrode structure 108 of an adjacent transistor 110. In some embodiments, application of a suitable bias voltage to the shielding material 130 substantially prevents or reduces an effect of an applied voltage to the gate electrode structure 108 of a transistor 110 on the channel regions of an adjacent transistor 110. Accordingly, the shielding material 130 may facilitate reduction or prevention of a so-called "wordline to wordline capacitance" between the second conductive lines 136 of adjacent transistors 110. In some embodiments, a wordline capacitance of the microelectronic device structure 100 is about 35 percent less than a wordline capacitance of a conventional device structure not including the shielding material 130.

In use and operation, the shielding material 130 may be biased at a voltage between −2.0 V and about 2.0 V, such as between about −2.0 V and about −1.5 V, between about −1.5 V and about −1.0 V, between about −1.0 V and about −0.5 V, between about −0.5 V and about 0 V, between about 0 V and about 0.5 V, between about 0.5 V and about 1.0 V, between about 1.0 V and about 1.5 V, or between about 1.5 V and about 2.0 V. In some embodiments, the shielding material 130 is biased at a voltage between about 0 V and about 0.5 V. In some embodiments, such as where the shielding material 130 is configured to be biased, the shielding material 130 may be referred to as a so-called "back gate" of the microelectronic device structure 100.

In use and operation, a voltage may be applied to one or more of the second conductive lines 136 (e.g., wordlines). In some embodiments, another voltage, which may be different (e.g., have a different magnitude) than the voltage applied to the one or more second conductive lines 136, is applied to the shielding material 130 located adjacent to the second conductive lines 136 to which the voltage is applied. Application of the another voltage to the shielding material 130 may reduce a wordline to wordline capacitance between second conductive lines 136 of adjacent transistors 110.

Accordingly, each transistor 110 of the array of transistors 110 may include a gate electrode structure 108, which may be located at a central portion of its respective transistor 110. The gate electrode structure 108 may be surrounded by the gate dielectric material 112 on one or more sides thereof. The gate dielectric material 112 may be in contact with each of the first channel region 116a and the second channel region 116b on an opposite side of which the gate electrode structure 108 is in contact. In other words, the gate dielectric material 112 may be disposed between the gate electrode structure 108 and opposing portions of the first channel region 116a and the second channel region 116b. Each of the first channel region 116a and the second channel region 116b are formed of and include an oxide semiconductor material. In some embodiments, each gate electrode structure 108 includes two channel regions associated therewith and may be located laterally between two discrete channels including the first channel region 116a and the second channel region 116b. Since the first channel region 116a and the second channel region 116b are located on the outside of the centrally located gate electrode structures 108, the gate electrode structures 108 of each transistor 110 may be formed to a larger thickness compared to conventional transistors while the pitch of the transistors 110 is the same as conventional transistors, as discussed in greater detail with reference to FIG. 3.

Accordingly, in at least some embodiments, an apparatus comprises a first conductive structure and at least one transistor in electrical communication with the first conductive structure. The at least one transistor comprises a lower conductive contact coupled to the first conductive structure and a split-body channel on the lower conductive contact. The split-body channel comprises a first semiconductive pillar and a second semiconductive pillar horizontally neighboring the first semiconductive pillar. The at least one transistor also comprises a gate structure horizontally interposed between the first semiconductive pillar and the second semiconductive pillar of the split-body channel and an upper conductive contact vertically overlying the gate structure and coupled to the split-body channel. Portions of the gate structure surround three sides of each of the first semiconductive pillar and the second semiconductive pillar.

Accordingly, in at least some embodiments, a method of operating a device structure comprises applying a bias voltage to a gate electrode of a device structure comprising a transistor. The transistor comprises a gate electrode, a gate dielectric material on at least opposing sides of the gate electrode, and a channel material on sides of the gate dielectric material, the gate electrode located between different portions of the channel material and substantially surrounding the channel material on at least three sides. The method further comprises applying another bias voltage to an electrically conductive material located between the transistor and at least another transistor of the device structure.

In some embodiments, the microelectronic device structure 100 includes one or more arrays of the transistors 110, such as a lateral array of transistors 110 extending in the X-direction and in the Y-direction. By way of non-limiting example, a pitch between adjacent microelectronic device structures 100 in each lateral direction within the array may be about 48×48 (e.g., 48 nm by 48 nm), about 40×40, about 32×32, about 20×20, or about 10×10. In some embodiments, the microelectronic device structure 100 includes a stack of transistors 110, such as in a 3D memory structure, such as in a stacked DRAM array. In some such embodiments, the microelectronic device structure 100 may include one or more decks of transistors 110, each deck vertically offset from other decks of transistors 110. Each deck of transistors 110 may be isolated from each other by insulative materials extending therebetween. For example, an electrically insulative material may be formed over the second conductive lines 136. The first conductive lines 104 of another deck of transistors 110 may be formed over the electrically insulative material 106 and transistors 110 may be formed over the first conductive lines 104 of the another deck to form a structure comprising multiple decks (e.g., two decks, three decks, four decks, eight decks, etc.) of transistors.

Figure 2A:
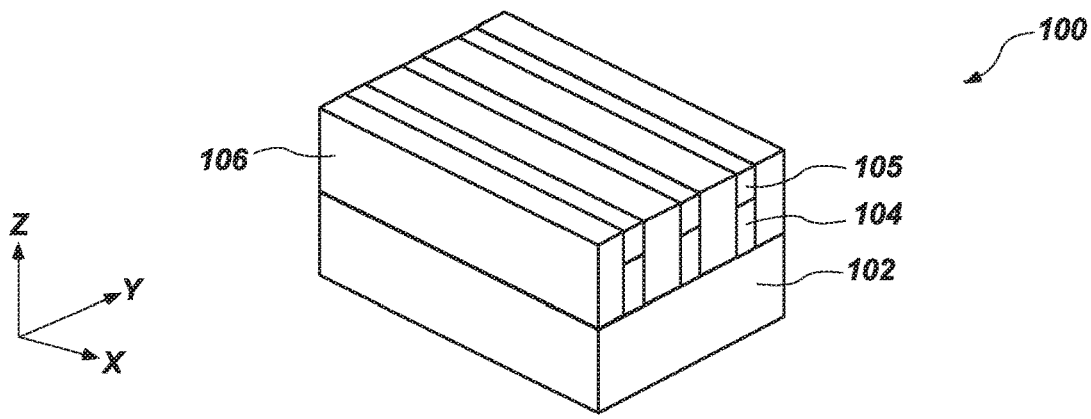
FIGS. 2A through 2K illustrate a method of forming an apparatus, in accordance with embodiments of the disclosure.

FIGS. 2A through 2K illustrate a method of forming the microelectronic device structure 100 described above with reference to FIGS. 1A and 1B, in accordance with some embodiments of the disclosure. FIG. 2A is a simplified perspective view of the microelectronic device structure 100. The microelectronic device structure 100 may include the first conductive lines 104 adjacent (e.g., over) the base material 102, the lower conductive contact 105 adjacent (e.g., over) the first conductive lines 104, and the electrically insulative material 106 adjacent to each of the first conductive lines 104 and the lower conductive contact 105. The first conductive lines 104 and the lower conductive contact 105 may be patterned prior to forming the electrically insulative material 106. The first conductive lines 104 and the lower conductive contact 105 may include lines extending in a first direction (e.g., the X-direction). In some embodiments, the electrically insulative material 106 is formed adjacent to (e.g., between adjacent portions of) the first conductive lines 104 and the lower conductive contact 105 after the first conductive lines 104 and the lower conductive contact 105 are patterned. In other embodiments, the electrically insulative material 106 is formed and patterned prior to forming the first conductive lines 104 and the lower conductive contact 105. Optionally, a shielding material (not shown) may be formed within the electrically insulative material 106 to electrically shield adjacent first conductive lines 104 from one another to reduce leakage that may result from coupling capacitance therebetween. Upper surfaces of the lower conductive contact 105 and/or the electrically insulative material 106 may be planarized, such as by one or more CMP acts. Accordingly, the electrically insulative material 106 may substantially fill spaces between patterned portions (e.g., lines) of the first conductive lines 104 and the lower conductive contact 105, as illustrated in the view of FIG. 2A.

Figure 2B:
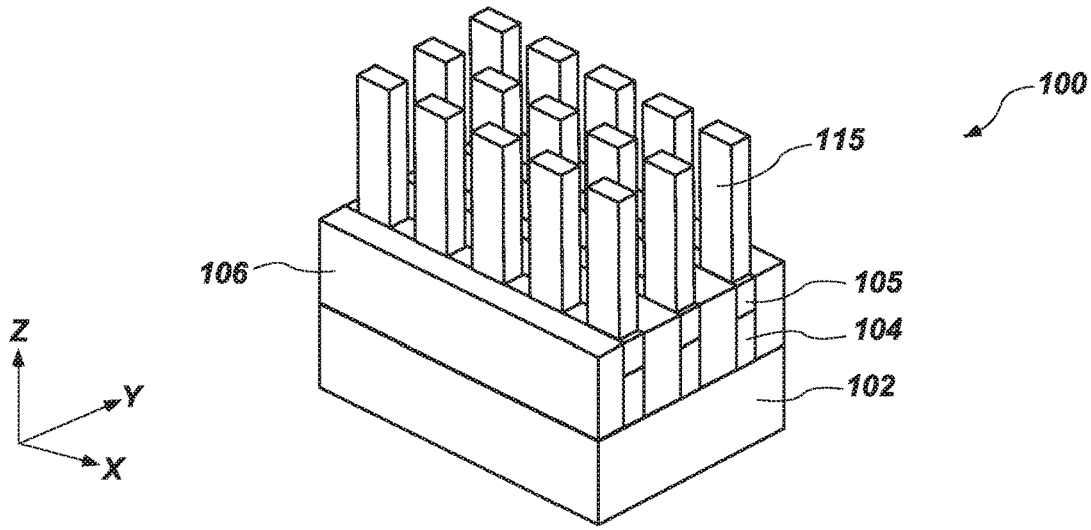

With reference to FIG. 2B, the split-body channels 116 (FIG. 1A) may initially be formed as semiconductive pillars 115 on the lower conductive contact 105 using conventional processes and conventional processing equipment, which are not described in detail herein. By way of non-limiting example, a semiconductive material may be conventionally formed and patterned (e.g., masked, photoexposed, developed, and etched) to form the semiconductive pillars 115. For example, the semiconductive pillars 115 may be formed by ALD, CVD, PVD, LPCVD, PECVD, another deposition method, or combinations thereof. In some embodiments, the initial material used to form the semiconductive pillars 115 is formed by atomic layer deposition. In some embodiments, individual semiconductive pillars 115 of the microelectronic device structure 100 are formed using one or more patterning processes. The semiconductive pillars 115 may include substantially the same material composition described above with reference to the first channel region 116*a* and the second channel region 116*b* of the split-body channels 116 (FIGS. 1A and 1B).

Figure 2C:
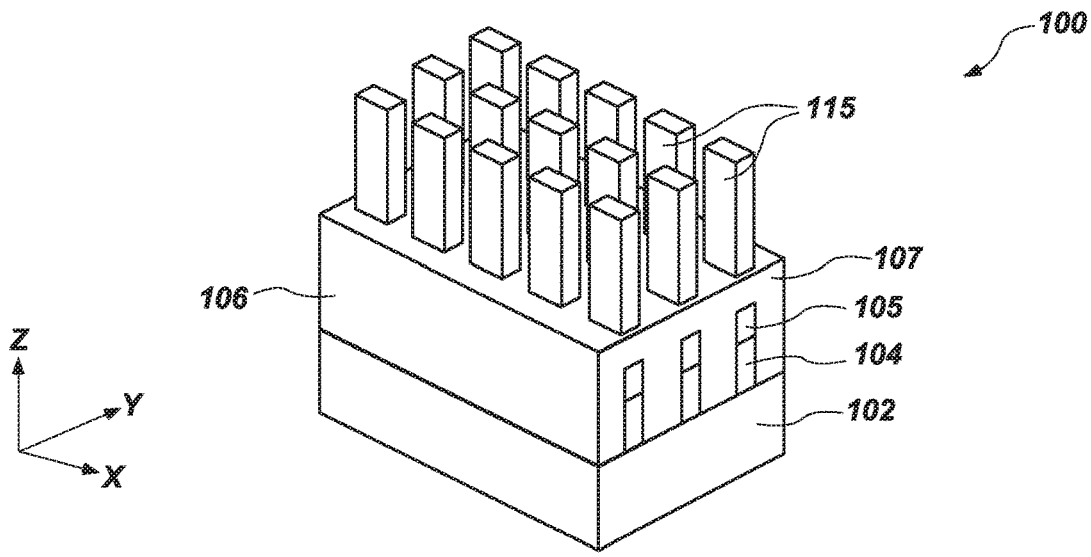

With reference to FIG. 2C, an additional portion (e.g., an upper portion 107) of the electrically insulative material 106 may be deposited to separate the individual semiconductive pillars 115 from one another and to electrically isolate (cover) exposed portions of the lower conductive contact 105. In some embodiments, the upper portion 107 includes substantially the same material composition as the electrically insulative material 106. Accordingly, the electrically insulative material 106 and the upper portion 107 thereof may include a unitary insulative material, which may correspond to the electrically insulative material 106.

Figure 2D:
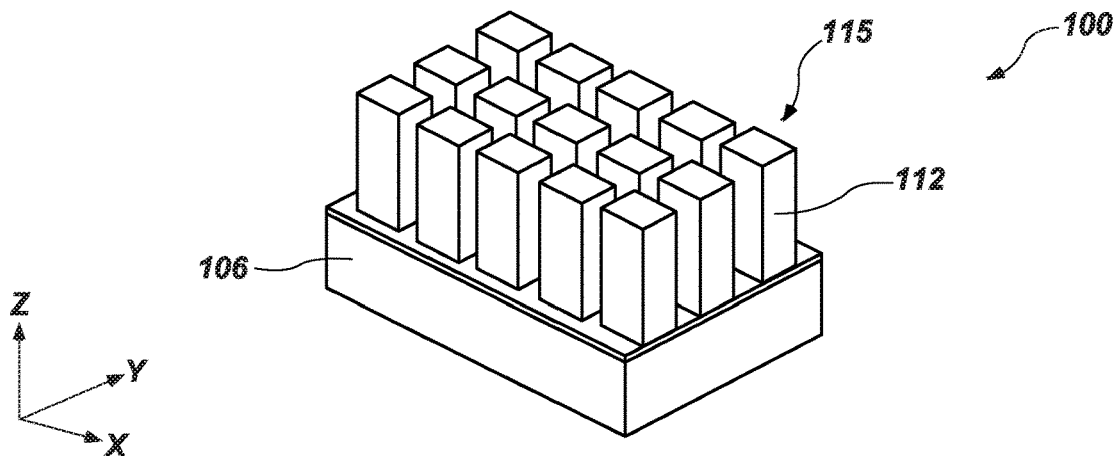

With reference to FIG. 2D, the gate dielectric material 112 may be formed adjacent (e.g., over) upper surfaces and sidewalls of the semiconductive pillars 115 and adjacent (e.g., over) exposed upper surfaces of the electrically insulative material 106. In some embodiments, the gate dielectric material 112 is formed of and includes silicon dioxide. In some embodiments, the gate dielectric material 112 is formed of and includes substantially the same material composition as the electrically insulative material 106. Accordingly, the electrically insulative material 106 and the gate dielectric material 112 may include a unitary insulative material, which may correspond to the gate dielectric material 112. Although FIGS. 2C through 2K illustrate the electrically insulative material 106 and the gate dielectric material 112 as separate components, it will be understood that the electrically insulative material 106 and the gate dielectric material 112 may include a unitary structure exhibiting a substantially uniform composition (e.g., silicon dioxide).

The gate dielectric material 112 may be formed by, for example, ALD, CVD, PVD, LPCVD, PECVD, another deposition method, or combinations thereof. The gate dielectric material 112 may be formed conformally over the semiconductive pillars 115. In some embodiments, at least portions of the gate dielectric material 112 and the electrically insulative material 106 between adjacent semiconductive pillars 115 is removed to expose portions of the lower conductive contact 105. For example, portions of the gate dielectric material 112 and the electrically insulative material 106 between adjacent semiconductive pillars 115 may be removed by exposing the gate dielectric material 112 and the electrically insulative material 106 between the adjacent semiconductive pillars 115 to a suitable etch chemistry, such as to a reactive ion etch chemistry formulated and configured to remove the gate dielectric material 112 and the electrically insulative material 106 without substantially removing the lower conductive contact 105.

Figure 2E:
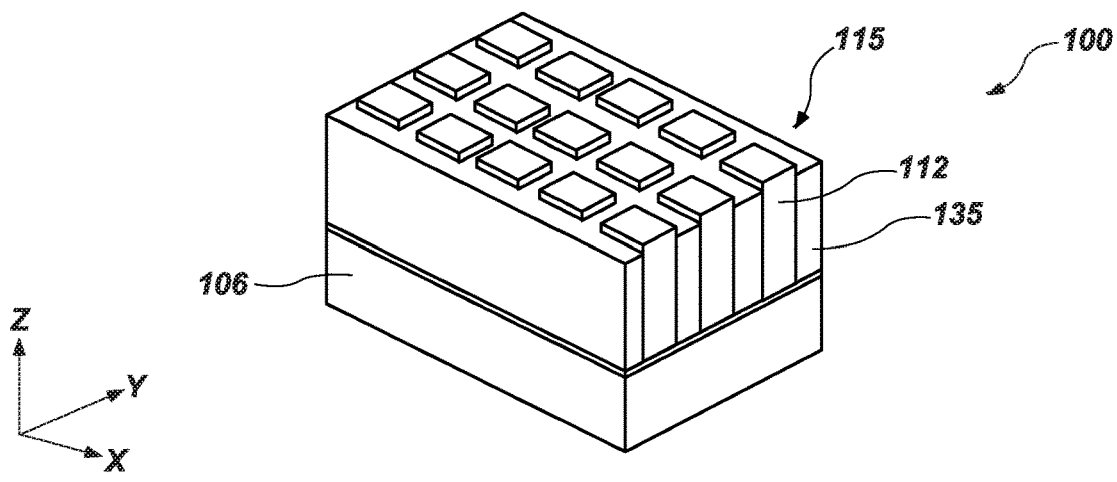

With reference to FIG. 2E, one or more electrically conductive materials 135 may be formed over the microelectronic device structure 100, such as adjacent to the gate dielectric material 112 and between the adjacent semiconductive pillars 115. The electrically conductive materials 135 may be formed using conventional processes (e.g., conventional deposition processes, such as one or more of in situ growth, spin-on coating, blanket coating, CVD, ALD, and PVD) and conventional processing equipment, which are not described in detail herein. In some embodiments, the electrically conductive materials 135 substantially surround the individual semiconductive pillars 115 prior to subsequent processing, as will be described herein.

Figure 2F:
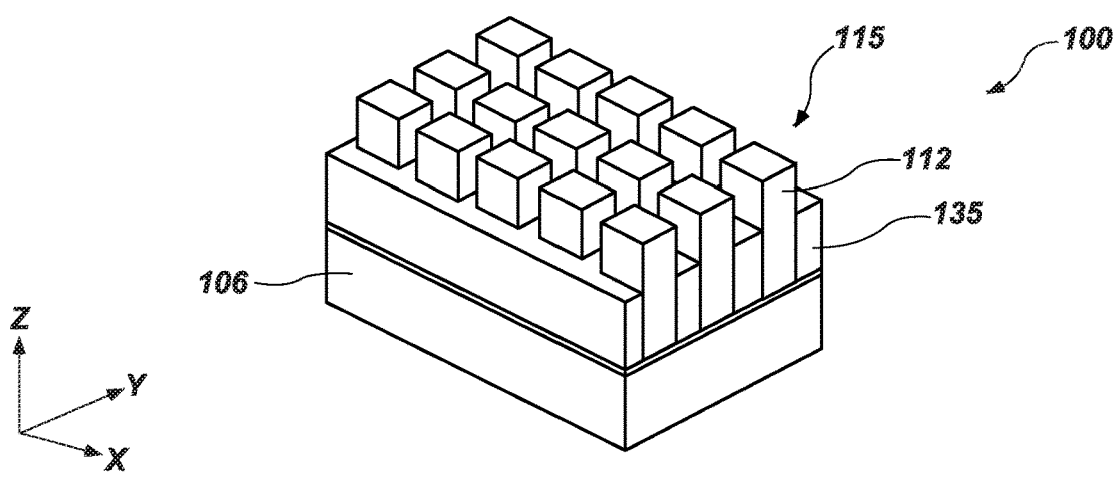

With reference to FIG. 2F, a portion of the electrically conductive materials 135 between the adjacent semiconductive pillars 115 may be removed by conventional techniques to recess the electrically conductive materials 135 and to expose upper surfaces of the semiconductive pillars 115. In some embodiments, at least portions of the upper surfaces of the semiconductive pillars 115 are also be removed. By way of example only, one or more dry etch processes or wet etch processes may be conducted to remove the upper portion of the electrically conductive materials 135. Although FIG. 2F illustrates the upper portion of the electrically conductive materials 135 having been removed, the disclosure is not so limited and the electrically conductive materials 135 may be substantially coextensive with the semiconductive pillars 115.

Figure 2G:
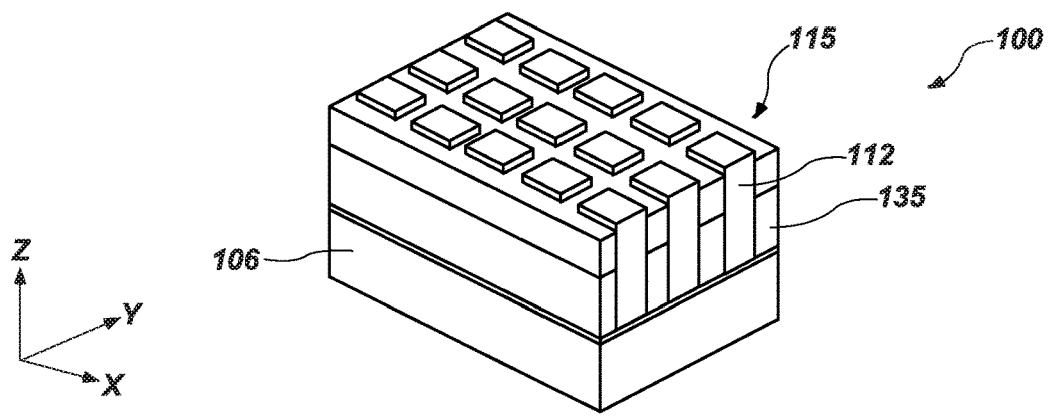

With reference to FIG. 2G, an electrically insulative material 138 may be deposited to separate the individual semiconductive pillars 115 from one another and to electrically isolate (cover) exposed portions of the electrically conductive materials 135. In some embodiments, the electrically insulative material 138 is formed of and includes $SiO_2$. In some embodiments, the electrically insulative material 138 is formed of and includes substantially the same material composition as the electrically insulative material 106 and/or the gate dielectric material 112. The materials may be subjected to at least one conventional planarization process (e.g., at least one conventional CMP process) to facilitate or enhance the planarity of an upper boundary (e.g., upper surface) of the electrically insulative material 138 and the semiconductive pillars 115 for further processing thereon.

Figure 2H:
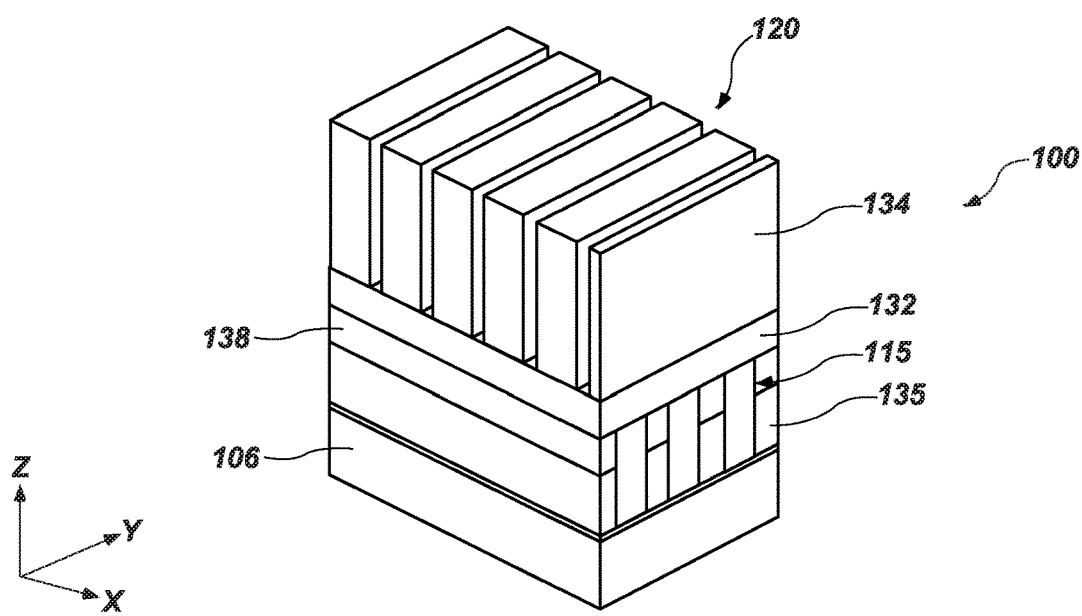
Figure 2I:
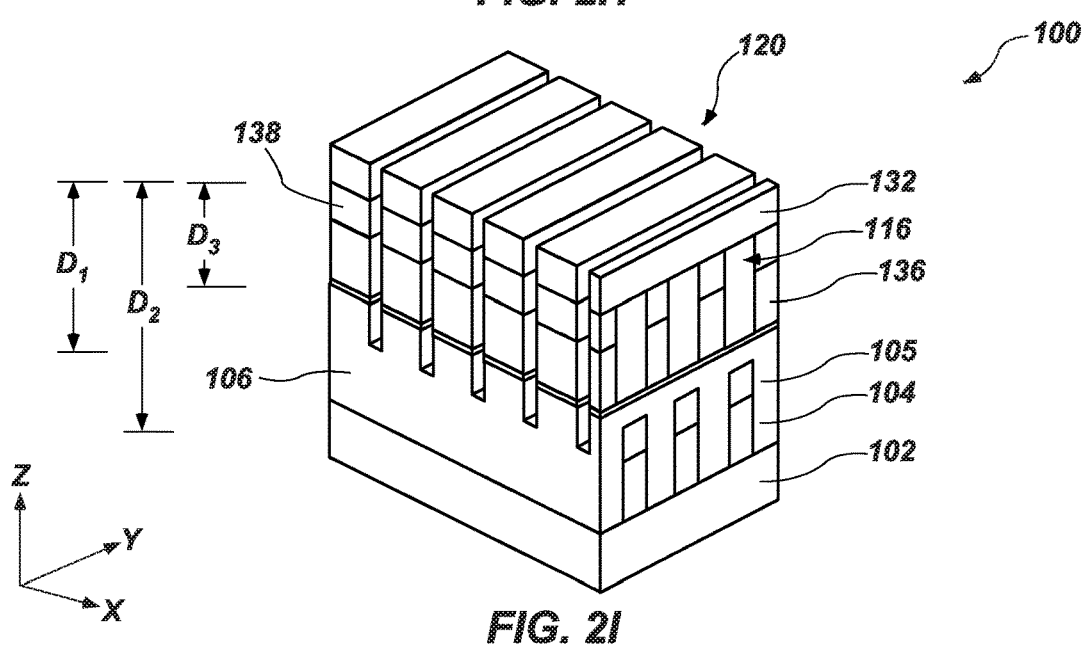

With reference to FIG. 2H in combination with FIG. 2I, the microelectronic device structure 100 may be patterned in the second direction (e.g., the Y-direction). In some embodiments, a first mask material 132 (e.g., a mask or a resist material) is placed over the electrically insulative material 138 and the semiconductive pillars 115 and the microelectronic device structure 100 is patterned in the second direction using a second mask material 134 (e.g., one or more chop masks) to form the openings 120, as shown in FIG. 2H. For example, a conventional method of forming the openings 120 includes transferring a pattern of openings and features in the second mask material 134 into the first mask material 132 overlying the electrically insulative material 138, and then using the first mask material 132 to selectively remove (e.g., selectively etch, selectively dry etch) the underlying materials in a first etch process to form the openings 120.

The first mask material 132 may also be referred to herein as a hard mask. By way of non-limiting example, the first mask material 132 may be formed of and include at least one of amorphous carbon, silicon, a silicon oxide, a silicon nitride, a silicon oxycarbide, aluminum oxide, and a silicon oxynitride. In some embodiments, the first mask material 132 is formed of and includes at least one oxide dielectric material (e.g., one or more of silicon dioxide and aluminum oxide). In other embodiments, the first mask material 132 is formed of and includes silicon nitride. The first mask material 132 may be homogeneous (e.g., may include a single material), or may be heterogeneous (e.g., may include a stack including at least two different materials). The first mask material 132 and the second mask material 134 may each individually be formed using conventional processes and patterned using conventional patterning and material removal processes, such as conventional photolithographic exposure processes, conventional development processes, conventional etching processes, and conventional processing equipment, which are not described in detail herein.

The first mask material 132 may substantially protect underlying materials (e.g., the first conductive lines 104 and the lower conductive contact 105) from etchants during patterning of transistors. In some embodiments, portions of each of the electrically insulative material 138, the gate electrode structure 108, the gate dielectric material 112, the electrically conductive materials 135, the electrically insulative material 106, and the semiconductive pillars 115 are patterned to form the transistors 110 of the split-body channels 116 (FIG. 1A). In some embodiments, portions of the upper conductive contact 114 and the semiconductive pillars 115 are removed by exposing the semiconductor material to wet etch or dry etch chemistries, for example, to separate the first channel region 116a from the second channel region 116b within the individual split-body channels 116 to form so-called "split-body" transistors. In other embodiments, one or more sacrificial materials having different etch properties than the remaining materials (e.g., the electrically insulative material 138, the gate electrode structure 108, the gate dielectric material 112, the electrically conductive materials 135, the electrically insulative material 106, and the semiconductive pillars 115) may be initially be formed within designated locations that are based, at least in part, on subsequent locations of the openings 120 and placement of additional materials therein, as will be described herein.

As shown in FIG. 2I, the materials may be removed to a first depth $D_1$ within the openings 120. The first depth $D_1$ may correspond to a distance (e.g., in the Z-direction) between an upper surface of the electrically insulative material 138 and an exposed upper surface of the electrically insulative material 106 within the openings 120. In other words, a vertical dimension (e.g., length) of the openings 120 corresponds to the first depth $D_1$. A second depth $D_2$ may correspond to a distance between the upper surface of the electrically insulative material 138 and an upper surface of the lower conductive contact 105, and a third depth $D_3$ may correspond to a distance between the upper surface of the electrically insulative material 138 and lower surfaces of the electrically conductive materials 135 (e.g., an upper surface of the electrically insulative material 106 and/or the gate dielectric material 112 underlying the electrically conductive materials 135). In some embodiments, the first depth $D_1$ is relatively less than the second depth $D_2$ and relatively greater than the third depth $D_3$. In other words, the openings 120 may be formed to a distance (e.g., to the first depth $D_1$) extending beyond the lower surfaces of the electrically conductive materials 135 without extending to the upper surface of the lower conductive contact 105, as shown in FIG. 2I. In other embodiments, the openings 120 are formed to a distance such that the openings 120 abut the upper surfaces of the lower conductive contact 105. In yet other embodiments, the openings 120 may be formed to a distance that extends beyond the upper surfaces of the lower conductive contact 105 without extending to upper surfaces of the first conductive lines 104. Accordingly, the openings 120 may extend through an entire height of the split-body channels 116. By way of non-limiting example, the first depth $D_1$ of the openings 120 may be between about 10 nm and about 100 nm, such as between about 10 nm and about 25 nm, between about 25 nm and about 50 nm, between about 50 nm and about 75 nm, or between about 75 nm and about 100 nm.

Once formed, the openings 120 may separate horizontally neighboring portions of the electrically conductive materials 135 to form the second conductive lines 136 (e.g., access lines, wordlines). The second conductive lines 136 may be characterized as so-called "single-body wordlines" for individual tri-gate transistors, as described above with reference to FIGS. 1A and 1B. Accordingly, the second conductive lines 136 may be formed adjacent (e.g., over) the gate dielectric material 112 by substantially filling spaces between the semiconductive pillars 115 (FIG. 2H) with the electrically conductive materials 135 and thereafter forming the openings 120 to form the split-body channels 116 by splitting individual semiconductive pillars 115 (FIG. 2H). Benefits of utilizing the single-body wordlines includes wider manufacturing tolerances in forming the split-body channels 116 as compared to conventional device structures including dual-gate electrodes on opposing sides of conventional pillar structures. Additional benefits of utilizing the single-body wordlines that are centrally located between opposing portions of the first channel region 116a and the second channel region 116b may also allow reduced thicknesses of channel materials as the transistors 110 are scaled down in size, without decreasing vertical stability within the split-body channels 116.

Figure 2J:
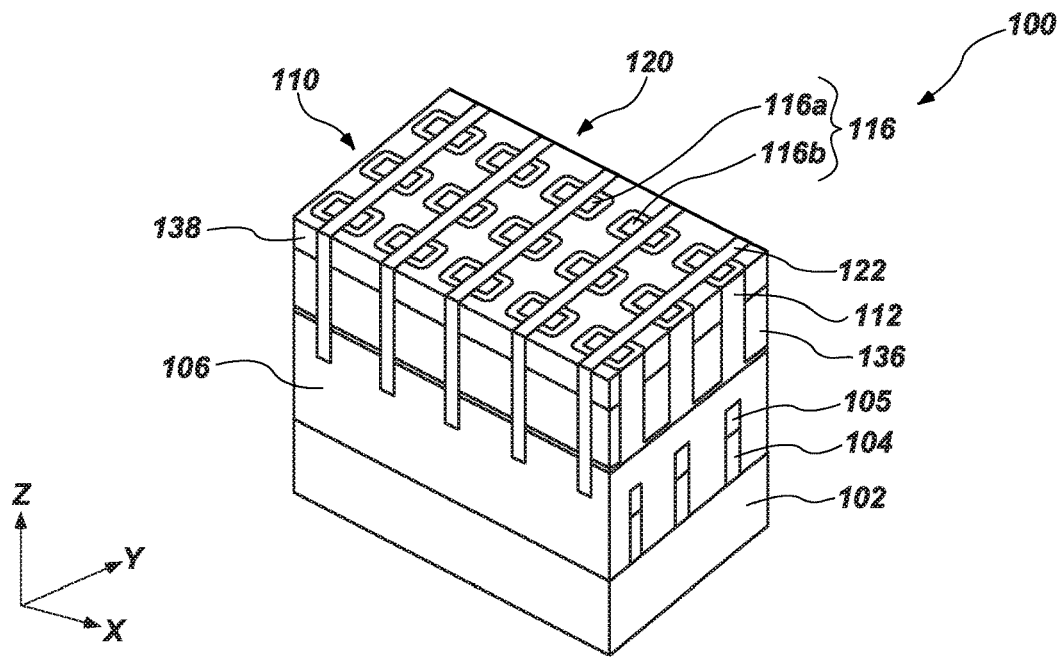

With reference to FIG. 2J, the openings 120 between horizontally neighboring transistors 110 may be substantially filled with materials of the isolation regions 122 (e.g., one or more of the passivation material 124, the dielectric material 126, the air gaps 128, and the shielding material 130), as described in greater detail with reference to FIG. 1B. The materials of the isolation regions 122 may be formed by, for example, ALD, CVD, PVD, LPCVD, PECVD, another deposition method, or combinations thereof. The electrically conductive contacts 131 (FIG. 1B) may be formed prior to or following formation of the shielding material 130. Numerous advantages are achieved by utilizing the process described above to form the microelectronic device structure 100. By utilizing the isolation regions 122 within the openings 120, increased accessibility may be achieved by providing enhanced access to the back side of the transistors 110 (e.g., opposite the second conductive lines 136). For example, access to back side of the transistors 110 may allow so-called "back side passivation" processes to form the passivation material 124 within the openings 120, which processes are unavailable in conventional devices having single-body pillar structures. Without being bound by any theory, it is believed that presence of the passivation material 124 adjacent to the back side of the transistors 110 functions to minimize instability commonly found within channel materials of conventional transistors and to improve device reliability by improving a so-called "photoresponse" within the channel materials of the first channel region 116a and the second channel region 116b, for example.

After forming the materials of the isolation regions 122 within the openings 120, horizontally neighboring transistors 110 will be physically and electrically isolated from one another. In other words, forming the materials of the isolation regions 122 substantially fills a volume between the horizontally neighboring transistors 110. Accordingly, spaces (e.g., the openings 120) between the first channel region 116a and the second channel region 116b of the split-body channels 116, as well as spaces between horizontally neighboring portions of the lateral portions 136b of the second conductive lines 136, may be substantially filled with one or more of the materials of the isolation regions 122, as shown in FIG. 2J. Lower surfaces of the isolation regions 122 may extend below the lower surfaces of each of the gate dielectric material 112 and the second conductive lines 136. In some embodiments the lower surfaces of the isolation regions 122 are adjacent the electrically insulative material 106 without extending to the upper surfaces of the lower conductive contact 105. In other embodiments, the lower surfaces of the isolation regions 122 abut upper surfaces of the lower conductive contact 105. In yet other embodiments, the lower surfaces of the isolation regions 122 extend beyond upper surfaces of the lower conductive contact 105 without being adjacent the first conductive lines 104.

Upper surfaces of the electrically insulative material 138, the gate dielectric material 112, the split-body channels 116, and the materials of the isolation regions 122 may be planarized, such as by one or more CMP acts following formation of the isolation regions 122 to facilitate or enhance the planarity of an upper boundary (e.g., upper surface) of the electrically insulative material 138 and the split-body channels 116 for further processing thereon. Accordingly, upper surfaces of each of the electrically insulative material 138, the gate dielectric material 112, each of the first channel region 116a and the second channel region 116b of the split-body channels 116, and the materials (e.g., the passivation material 124, the dielectric material 126, and/or the shielding material 130) of the isolation regions 122 may be substantially coplanar with one another. In some embodiments, an upper portion of the shielding material 130 is not coplanar with an upper portion of the gate electrode structure 108.

Figure 2K:
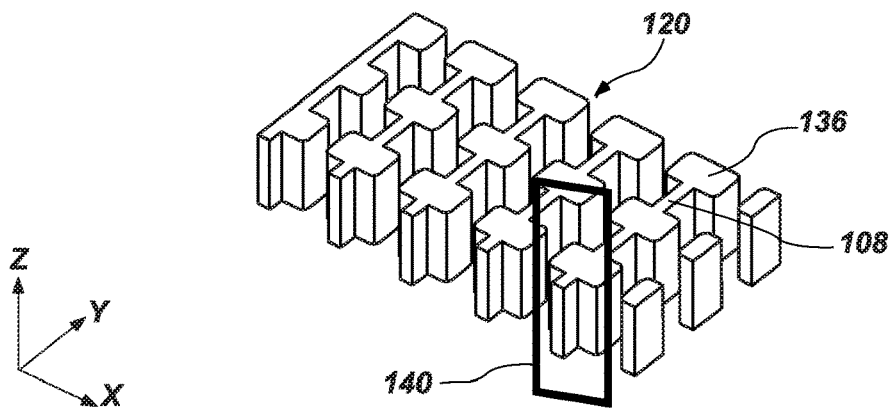

With reference to FIG. 2K, the second conductive lines 136, including the gate electrode structure 108 of individual transistors 110 (FIG. 2J) are illustrated. For clarity and ease of understanding the drawings and associated description, surrounding materials including the electrically insulative material 106, the electrically insulative material 138, the split-body channels 116, and the isolation regions 122 are absent from FIG. 2K. As discussed in greater detail above with reference to FIG. 1B, the second conductive lines 136 may include central elongated portions 136a that extend as lines extending in, for example, the Y-direction and lateral portions 136b extending away from the central elongated portions 136a. Accordingly, the second conductive lines 136 may surround the split-body channels 116 (FIG. 2J) on at least three sides and the second conductive lines 136 may be characterized as so-called "single-body wordlines" for individual tri-gate transistors within the individual device region 140.

Although FIGS. 2A through 2K have been described as forming different components of the microelectronic device structure 100 in a particular order, the disclosure is not so limited. For example, although the upper conductive contact 114 has been described as being formed after forming the second conductive lines 136 including the gate electrode structure 108, the disclosure is not so limited to the particular order of forming components of the microelectronic device structure 100. In other embodiments, the upper conductive contact 114 may be formed after forming the isolation regions 122 within the openings 120 by forming a first upper conductive contact 114 in contact with the first channel region 116a of the split-body channel 116 and forming a second upper conductive contact 114 in contact with the second channel region 116b thereof. In some such embodiments, the shielding material 130 and the electrically insulative material 106 over the transistors 110 (FIG. 2J) may be removed from over surfaces of the transistors 110 to form openings in the shielding material 130 and the electrically insulative material 106 and expose the upper portion of the gate dielectric material 112. The upper conductive contact 114 may be formed within the openings. Thereafter, the upper conductive contact 114, the shielding material 130, and the electrically insulative material 106 may be removed from upper surfaces of the microelectronic device structure 100, such as by chemical mechanical planarization. Apparatuses including the transistors 110 of the microelectronic device structure 100 formed in accordance with embodiments of the disclosure may be formed by conducting additional process acts, which are not described in detail herein.

Figure 3:
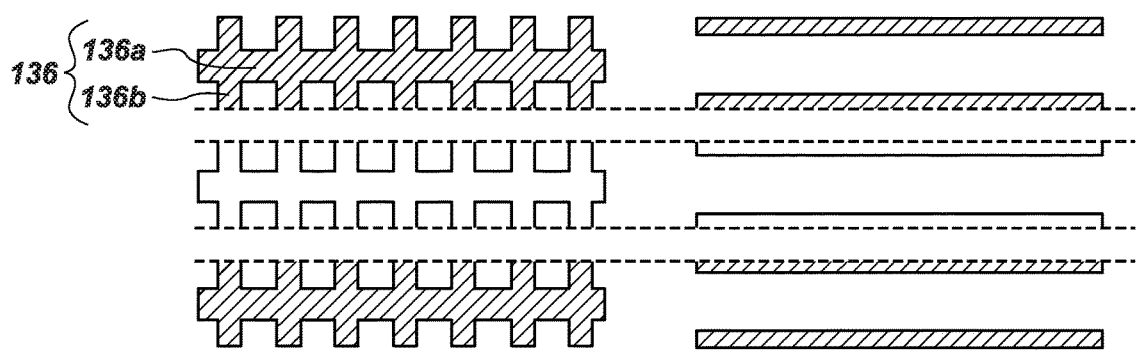
FIG. 3 is a simplified top cross-sectional view of a portion of the apparatus of FIGS. 1A and 1B for comparison with conventional device structures.

FIG. 3 illustrates a simplified top cross-sectional view of a portion of the microelectronic device structure 100 of FIG. 1B for comparison with conventional device structures. As discussed above, since the opposing channel regions are located on the outside of the centrally located gate electrode structures 108 (FIG. 1B), the gate electrode structures 108, corresponding to portions of the second conductive lines 136 within each of the transistors 110, may be formed to a larger thickness compared to conventional transistors while the pitch of the transistors 110 is the same as that of conventional transistors. The larger thickness of the gate electrode structures 108 increases the area thereof, and therefore, reduces the electrical resistance thereof. As a result, the RC (product of resistance and capacitance) of the transistors 110 may be reduced, which may correlate to an increase in the switching speed of the transistors 110. The transistors 110 may deliver the same current (e.g., about 5 µA/Dev) as conventional transistors arranged in the same pitch. In some embodiments, the larger thickness of the gate electrode structures 108 (shown in FIG. 1B as thickness $T_2$) is twice that of thicknesses of gate electrodes of conventional device structures. By way of non-limiting example, the thickness $T_2$ of the gate electrode structure 108 may be about 10 nm, in some embodiments. In contrast, a thickness of each of the two wordlines associated with conventional devices (e.g., dual-gate devices) may be about 5 nm. In some embodiments, a resistivity of the microelectronic device structure 100, according to embodiments of the disclosure, is about 30 percent less than a resistivity of conventional device structures having the same pitch.

Additional benefits of the configuration of the second conductive lines 136 (e.g., single-body wordlines) as compared to dual-gate wordlines of conventional device structures, include reducing leakage as a result of coupling capacitance between adjacent transistors. For example, large wordline to wordline capacitance may cause leakage between wordlines when a target wordline is "turned on." Without being bound by any particular theory, it is believed that by reducing the surface area presented to adjacent wordlines of the second conductive lines 136, undesirable leakage may be minimized (e.g., prevented). In other words, a reduced surface area of end surfaces of each of the lateral portions 136b of the second conductive lines 136 presented to other end surfaces of the lateral portions 136b of adjacent second conductive lines 136 is significantly less than a surface area of a full length of the wordlines of the dual-gate wordlines (e.g., electrodes) presented to a full length of adjacent wordlines of the conventional devices. In some embodiments, the reduced surface area of the end surfaces of the lateral portions 136b substantially prevents or reduces an effect of an applied voltage to one of the second conductive lines 136 on the adjacent second conductive lines 136 and, thus, the gate electrode structure 108 of an adjacent transistor 110 (FIG. 1A). Accordingly, the transistors 110 of the microelectronic device structure 100 may exhibit a higher threshold voltage ($V_{TH}$) compared to conventional transistors and may also exhibit a lower magnitude of off current ($I_{off}$) compared to conventional transistors. In some embodiments, the transistors 110 may be in the off state with about 0 V applied to the gate electrode structure 108 (FIG. 1B). In other words, a negative voltage may not be applied to the gate electrode structure 108 when the transistors 110 are in the off state. By way of contrast, conventional transistors including a greater surface area along the full length of the wordlines, and not including the lateral portions 136b of a tri-gate device, may exhibit leakage current when the transistors are in the off state if a substantial negative voltage is not applied to the gate electrode (e.g., an off voltage having a magnitude larger than about 1.0). In some embodiments, application of a voltage to a gate electrode structure 108 of one transistor 110 may not affect the gate electrode structure 108 or the channel regions of an adjacent transistor 110. In other embodiments, a lower negative voltage (e.g., less than −1 V) may be used to suppress the off current ($I_{off}$) to reduce coupling capacitance between adjacent transistors.

Accordingly, transistors 110 may be formed of and include the first channel region 116a and the second channel region 116b located on sides of the gate electrode structure 108. In some embodiments, the gate electrode structure 108 of each transistor 110 is located at a laterally central position of the transistor 110 and the first channel region 116a and the second channel region 116b are located adjacent to, such as on opposing sides (e.g., lateral sides), of the gate electrode structure 108. The gate electrode structure 108 may surround each of the first channel region 116a and the second channel region 116b on at least three sides. A vertical length (e.g., in the Z-direction) of each of the first channel region 116a and the second channel region 116b may be greater than a vertical length of the gate electrode structure 108.

Accordingly, in at least some embodiments, a method of forming a device structure comprises forming a conductive line extending in a first direction, forming semiconductive pillar structures over the conductive line, forming a conductive material horizontally between at least two of the semiconductive pillar structures, forming openings vertically extending through portions of the semiconductive pillar structures and the conducive material to separate each of the at least two of the semiconductive pillar structures into two relatively smaller semiconductive pillar structures and form gate structures from the conductive material, and at least partially filling the openings with dielectric material. Central portions of the gate structures extend in a second direction transverse to the first direction.

Figure 4:
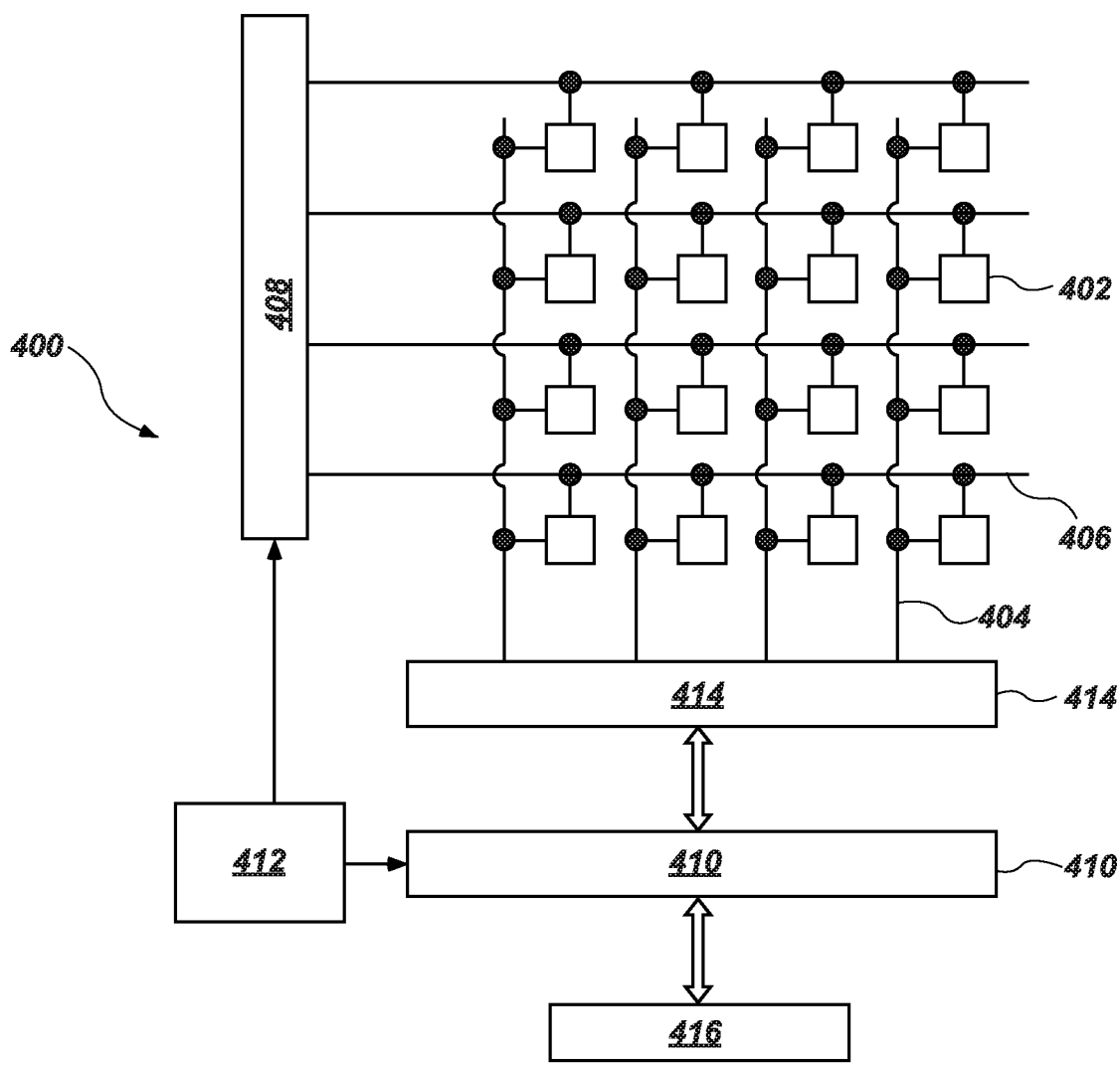
FIG. 4 is a functional block diagram of a memory device, in accordance with an embodiment of the disclosure.

FIG. 4 illustrates a functional block diagram of a memory device 400, in accordance with an embodiment of the disclosure. The memory device 400 may include, for example, an embodiment of the microelectronic device structure 100 previously described herein. As shown in FIG. 4, the memory device 400 may include memory cells 402, digit lines 404 (e.g., corresponding to the first conductive lines 104 of the microelectronic device structure 100 shown in FIGS. 1A through 1B), wordlines 406 (e.g., corresponding to the second conductive lines 136 of the microelectronic device structure 100 shown in FIGS. 1A and 1B), a row decoder 408, a column decoder 410, a memory controller 412, a sense device 414, and an input/output device 416.

The memory cells 402 of the memory device 400 are programmable to at least two different logic states (e.g., logic 0 and logic 1). Each memory cell 402 may individually include a capacitor and transistor (e.g., a pass transistor). The capacitor stores a charge representative of the programmable logic state (e.g., a charged capacitor may represent a first logic state, such as a logic 1; and an uncharged capacitor may represent a second logic state, such as a logic 0) of the memory cell 402. The transistor grants access to the capacitor upon application (e.g., by way of one of the wordlines 406) of a minimum threshold voltage to a semiconductive channel thereof for operations (e.g., reading, writing, rewriting) on the capacitor.

The digit lines 404 are connected to capacitors of the memory cells 402 by way of the transistors (e.g., corresponding to the transistors 110 of the microelectronic device structure 100 shown in FIGS. 1A and 1B) of the memory cells 402. The wordlines 406 extend perpendicular to the digit lines 404, and are connected to gates of the transistors of the memory cells 402. Operations may be performed on the memory cells 402 by activating appropriate digit lines 404 and wordlines 406. Activating a digit line 404 or a wordline 406 may include applying a voltage potential to the digit line 404 or the wordline 406. Each column of memory cells 402 may individually be connected to one of the digit lines 404, and each row of the memory cells 402 may individually be connected to one of the wordlines 406. Individual memory cells 402 may be addressed and accessed through the intersections (e.g., cross points) of the digit lines 404 and the wordlines 406.

The memory controller 412 may control the operations of memory cells 402 through various components, including the row decoder 408, the column decoder 410, and the sense device 414. The memory controller 412 may generate row address signals that are directed to the row decoder 408 to activate (e.g., apply a voltage potential to) predetermined wordlines 406, and may generate column address signals that are directed to the column decoder 410 to activate (e.g., apply a voltage potential to) predetermined digit lines 404. The memory controller 412 may also generate and control various voltage potentials employed during the operation of the memory device 400. In general, the amplitude, shape, and/or duration of an applied voltage may be adjusted (e.g., varied), and may be different for various operations of the memory device 400.

During use and operation of the memory device 400, after being accessed, a memory cell 402 may be read (e.g., sensed) by the sense device 414. The sense device 414 may compare a signal (e.g., a voltage) of an appropriate digit line 404 to a reference signal in order to determine the logic state of the memory cell 402. If, for example, the digit line 404 has a higher voltage than the reference voltage, the sense device 414 may determine that the stored logic state of the memory cell 402 is a logic 1, and vice versa. The sense device 414 may include transistors and amplifiers to detect and amplify a difference in the signals (commonly referred to in the art as "latching"). The detected logic state of a memory cell 402 may be output through the column decoder 410 to the input/output device 416. In addition, a memory cell 402 may be set (e.g., written) by similarly activating an appropriate wordline 406 and an appropriate digit line 404 of the memory device 400. By controlling the digit line 404 while the wordline 406 is activated, the memory cell 402 may be set (e.g., a logic value may be stored in the memory cell 402). The column decoder 410 may accept data from the input/output device 416 to be written to the memory cells 402. Furthermore, a memory cell 402 may also be refreshed (e.g., recharged) by reading the memory cell 402. The read operation will place the contents of the memory cell 402 on the appropriate digit line 404, which is then pulled up to full level (e.g., full charge or discharge) by the sense device 414. When the wordline 406 associated with the memory cell 402 is deactivated, all of memory cells 402 in the row associated with the wordline 406 are restored to full charge or discharge.

Accordingly, a memory device according to embodiments of the disclosure comprises a memory cell comprising an access device electrically coupled to a memory element. The access device comprises an electrically conductive material comprising elongated portions extending in a direction and lateral protrusions extending in another direction substantially transverse to the direction, a first channel region neighboring a first side of the electrically conductive material, and a second channel region neighboring a second side of the electrically conductive material. The second side is opposite the first side. The access device also comprises a gate dielectric between the first channel region and the electrically conductive material and between the second channel region and the electrically conductive material.

Figure 5:
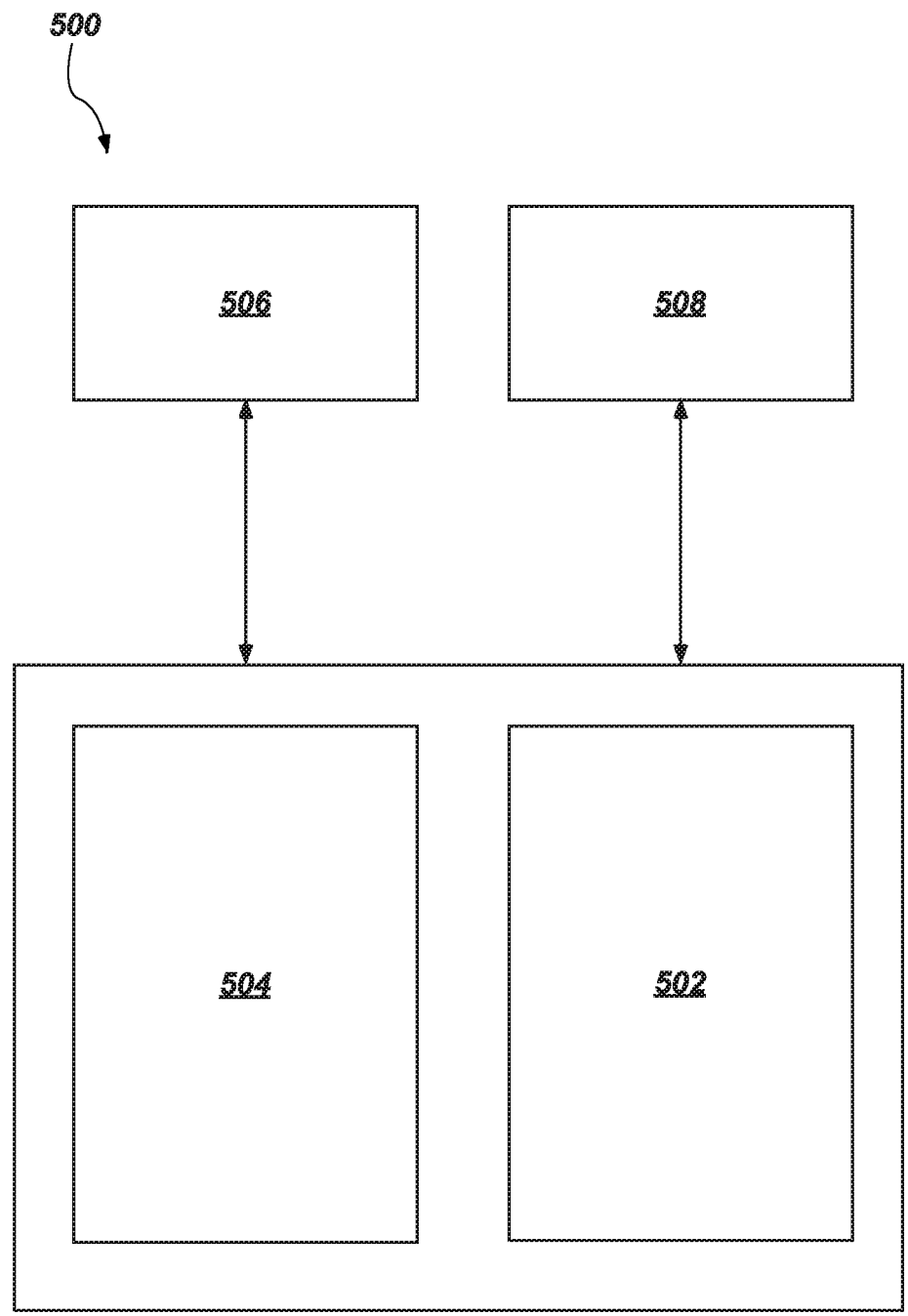
FIG. 5 is a schematic block diagram of an electronic system, in accordance with an embodiment of the disclosure.

Device structures (e.g., the microelectronic device structure 100) including the split-body transistors 110 including channel regions (e.g., the first channel region 116a, the second channel region 116b) and a gate electrode structure 108 horizontally interposed between the first channel region 116a and the second channel region 116b of the split-body channel 116 in accordance with embodiments of the disclosure may be used in embodiments of electronic systems of the disclosure. For example, FIG. 5 is a block diagram of an illustrative electronic system 500 according to embodiments of disclosure. The electronic system 500 may include, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 500 includes at least one memory device 502. The memory device 502 may include, for example, an embodiment of one or more of a device structure (e.g., microelectronic device structure 100) and a microelectronic device (e.g., the memory device 400) previously described herein. The electronic system 500 may further include at least one electronic signal processor device 504 (often referred to as a "microprocessor"). The electronic signal processor device 504 may, optionally, include an embodiment of a device structure (e.g., the microelectronic device structure 100) and a microelectronic device (e.g., the memory device 400) previously described herein. The electronic system 500 may further include one or more input devices 506 for inputting information into the electronic system 500 by a user, such as, for example, a mouse or other pointing device, a keyboard, a touchpad, a button, or a control panel. The electronic system 500 may further include one or more output devices 508 for outputting information (e.g., visual or audio output) to a user such as, for example, a monitor, a display, a printer, an audio output jack, a speaker, etc. In some embodiments, the input device 506 and the output device 508 may include a single touchscreen device that can be used both to input information to the electronic system 500 and to output visual information to a user. The input device 506 and the output device 508 may communicate electrically with one or more of the memory device 502 and the electronic signal processor device 504.

Thus, in accordance with embodiments of the disclosure, an electronic system comprises at least one input device, at least one output device, at least one processor device operably coupled to the at least one input device and the at least one output device, and a device operably coupled to the at least one processor device. The device comprises an array of transistors. At least one transistor of the array of transistors comprises a gate structure overlying a conductive contact, a first pillar structure horizontally neighboring a first lateral side of the gate structure, a second pillar structure horizontally neighboring a second lateral side of the gate structure opposite the first lateral side. The gate structure is located between the first pillar structure and the second pillar structure. The at least one transistor also comprises a passivation material adjacent to each of the first pillar structure and the second pillar structure on a side opposite the gate structure. The passivation material is in direct physical contact with portions of the gate structure.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. An apparatus, comprising:
    conductive structures; and
    at least two horizontally neighboring transistors of a volatile memory device in electrical communication with the conductive structures, the at least two horizontally neighboring transistors individually comprising:
        a lower conductive contact coupled to one of the conductive structures;
        a split-body channel on the lower conductive contact and comprising:
            a first semiconductive pillar; and
            a second semiconductive pillar horizontally neighboring the first semiconductive pillar;
        a gate structure horizontally interposed between the first semiconductive pillar and the second semiconductive pillar of the split-body channel, the gate structure configured as a single-body access line with portions of the gate structure surrounding three sides of each of the first semiconductive pillar and the second semiconductive pillar; and
        an upper conductive contact vertically overlying the gate structure and coupled to the split-body channel; and
    an electrically conductive material horizontally interposed between and electrically isolated from the at least two horizontally neighboring transistors.

2. The apparatus of claim 1, further comprising a single gate dielectric material directly horizontally between the gate structure and the three sides of each of the first semiconductive pillar and the second semiconductive pillar of the split-body channel.

3. The apparatus of claim 1, further comprising a dielectric material vertically intervening between the gate structure and the upper conductive contact and horizontally intervening between the gate structure and the upper conductive contact.

4. The apparatus of claim 1, wherein the first semiconductive pillar and the second semiconductive pillar each comprise at least one oxide semiconductor material.

5. The apparatus of claim 1, wherein the first semiconductive pillar and the second semiconductive pillar of the split-body channel are each vertically on the lower conductive contact.

6. The apparatus of claim 1, further comprising at least one conductive routing structure coupled to and extending from and between the gate structure and at least one other structure.

7. The apparatus of claim 1, further comprising a single passivation material on a side of each of the first semiconductive pillar and the second semiconductive pillar not surrounded by the gate structure, the single passivation material directly physically contacting the gate structure and a semiconductive material of each of the first semiconductive pillar and the second semiconductive pillar.

8. The apparatus of claim 1, wherein the gate structure comprises a single, continuous portion of a conductive material horizontally intervening between the first semiconductive pillar and the second semiconductive pillar.

9. A memory device, comprising:
    a memory cell of a volatile memory device comprising an access device electrically coupled to a memory element, the access device comprising:
        an electrically conductive material of a gate structure comprising elongated portions extending in a first horizontal direction and lateral protrusions extending in a second horizontal direction substantially transverse to the first horizontal direction, the elongated portions of the electrically conductive material configured as single-body access lines;
        a first channel region neighboring a first side of the electrically conductive material;

a second channel region neighboring a second side of the electrically conductive material, the second side opposite the first side; and a gate dielectric between the first channel region and the electrically conductive material of the gate structure and between the second channel region and the electrically conductive material; and a shielding material and at least one dielectric material separating horizontally neighboring access devices, the shielding material comprising conductive material electrically and physically isolated from each of the first channel region and the second channel region.

10. The memory device of claim 9, wherein each of the first channel region and the second channel region is adjacent to the electrically conductive material in a first horizontal plane and in a second horizontal plane intersecting the first horizontal plane.

11. The memory device of claim 9, further comprising a single passivation material directly adjacent to each of the first channel region and the second channel region on a side opposite the electrically conductive material.

12. The memory device of claim 11, wherein each of the first channel region and the second channel region comprises an oxide semiconductor material and the single passivation material comprises a silicon nitride material or an yttrium oxide material.

13. The memory device of claim 9, wherein each of the first channel region and the second channel region comprises at least one of ZTO, IZO, $ZnO_x$, IGZO, IGSO, $InO_x$, $In_2O_3$, $SnO_2$, $TiO_x$, $Zn_xO_yN_z$, $Mg_xZn_yO_z$, $In_xZn_yO_z$, $In_xGa_yZn_zO_a$, $Zr_xIn_yZn_zO_a$, $Hf_xIn_yZn_zO_a$, $Sn_xIn_yZn_zO_a$, $Al_xSn_yIn_zZn_aO_d$, $Si_xIn_yZn_zO_a$, $Zn_xSn_yO_z$, $Al_xZn_ySn_zO_a$, $Ga_xZn_ySn_zO_a$, $Zr_xZn_ySn_zO_a$, InGaSiO, or IWO.

14. The memory device of claim 9, wherein the lateral protrusions of the electrically conductive material extend horizontally from the elongated portions thereof on a first side of the elongated portions and on an opposing second side of the elongated portions, the lateral protrusions of the first side extending between horizontally neighboring portions of respective first channel regions of adjacent transistors, and the lateral protrusions of the second side extending between horizontally neighboring portions of respective second channel regions of adjacent transistors.

15. The memory device of claim 9, wherein the access device comprises a tri-gate transistor comprising a single gate structure.

16. The memory device of claim 9, wherein the volatile memory device is a dynamic random access memory (DRAM) device comprising DRAM memory cells.

17. The memory device of claim 9, wherein the gate dielectric comprises a single material directly between the first channel region and the electrically conductive material of the gate structure and directly between the second channel region and the electrically conductive material, the gate dielectric extending in a first horizontal direction and in a second horizontal direction and substantially surrounding each of the first channel region and the second channel region on three consecutive sides.

18. An electronic system, comprising:
at least one input device;
at least one output device;
at least one processor device operably coupled to the at least one input device and the at least one output device; and
a dynamic random access memory (DRAM) device operably coupled to the at least one processor device, the DRAM device comprising:
an array of transistors, at least one transistor of the array of transistors comprising:
a gate structure overlying a conductive contact;
a first pillar structure horizontally neighboring a first lateral side of the gate structure;
a second pillar structure horizontally neighboring a second lateral side of the gate structure opposite the first lateral side, the gate structure located between the first pillar structure and the second pillar structure and configured as a single-body word line of the at least one transistor; and
a passivation material adjacent to each of the first pillar structure and the second pillar structure on a side opposite the gate structure, the passivation material in direct physical contact with portions of the gate structure; and
a shielding material adjacent to the passivation material and separating horizontally neighboring transistors of the array of transistors, the shielding material comprising conductive material electrically and physically isolated from channel regions of each of the first pillar structure and the second pillar structure.

19. The electronic system of claim 18, further comprising a digit line and a digit line contact overlying the digit line, the gate structure overlying the digit line contact.

20. The electronic system of claim 18, wherein the passivation material comprises a single material directly adjacent to each of the first pillar structure and the second pillar structure.

21. An apparatus, comprising:
a digit line extending in a horizontal direction, the digit line overlying an upper surface of a base material and horizontally neighboring additional digit lines separated from the digit line by insulative material; and
at least one transistor of a volatile memory device in electrical communication with the digit line and comprising:
a lower conductive contact coupled to the digit line, the lower conductive contact comprising a separate digit line contact vertically overlying and coupled to the digit line;
a split-body channel on the lower conductive contact and comprising:
a first semiconductive pillar; and
a second semiconductive pillar horizontally neighboring the first semiconductive pillar;
a gate structure horizontally interposed between the first semiconductive pillar and the second semiconductive pillar of the split-body channel, the gate structure configured as a single-body access line with portions of the gate structure surrounding three sides of each of the first semiconductive pillar and the second semiconductive pillar; and
an upper conductive contact vertically overlying the gate structure and coupled to the split-body channel.

* * * * *